(12) United States Patent
Terai

(10) Patent No.: US 8,106,444 B2
(45) Date of Patent: Jan. 31, 2012

(54) SEMICONDUCTOR DEVICE

(75) Inventor: Masayuki Terai, Tokyo (JP)

(73) Assignee: NEC Corporation, Tokyo (JP)

( * ) Notice: Subject to any disclaimer, the term of this patent is extended or adjusted under 35 U.S.C. 154(b) by 264 days.

(21) Appl. No.: 12/514,647

(22) PCT Filed: Nov. 5, 2007

(86) PCT No.: PCT/JP2007/071860
§ 371 (c)(1),
(2), (4) Date: May 13, 2009

(87) PCT Pub. No.: WO2008/059768
PCT Pub. Date: May 22, 2008

(65) Prior Publication Data
US 2010/0025753 A1 Feb. 4, 2010

(30) Foreign Application Priority Data
Nov. 14, 2006 (JP) .................................. 2006-307373

(51) Int. Cl.
*H01L 29/792* (2006.01)
*H01L 29/04* (2006.01)
(52) U.S. Cl. . 257/324; 257/255; 257/315; 257/E29.309; 257/E29.004
(58) Field of Classification Search .................. 257/324, 257/E29.309, E25.5, E29.004, 315
See application file for complete search history.

(56) References Cited

U.S. PATENT DOCUMENTS

| 5,838,041 A | * | 11/1998 | Sakagami et al. | ............. 257/324 |
| 7,087,955 B2 | * | 8/2006 | Kawashima et al. | ......... 257/316 |
| 7,141,849 B2 | * | 11/2006 | Iwata et al. | .................... 257/324 |

FOREIGN PATENT DOCUMENTS

| JP | 1995169864 A | 7/1995 |
| JP | 2001230332 A | 8/2001 |
| JP | 2004186663 A | 7/2004 |
| JP | 2004282029 A | 10/2004 |
| JP | 2004303918 A | 10/2004 |
| JP | 2005142600 A | 6/2005 |

OTHER PUBLICATIONS

International Search Report for PCT/JP2007/071860 mailed Jan. 22, 2008.

* cited by examiner

*Primary Examiner* — Ngan Ngo
*Assistant Examiner* — Benjamin Tzu-Hung Liu

(57) ABSTRACT

Provided is a semiconductor device including: source-drain regions formed on a silicon substrate with a channel forming region sandwiched therebetween; a word gate electrode formed on the channel forming region via a word gate insulating film not including a charge storage layer; a control gate formed on the silicon substrate on one side of the word gate electrode via a trap insulating film including a charge storage layer; and a control gate formed on the silicon substrate on the other side of the word gate electrode via a trap insulating film including a charge storage layer. A bottom of the word gate electrode is made to be higher than the control gate and a bottom of the control gate, and a level difference between the bottoms of the electrodes is made to be larger than a physical film thickness of the word gate insulating film.

24 Claims, 14 Drawing Sheets

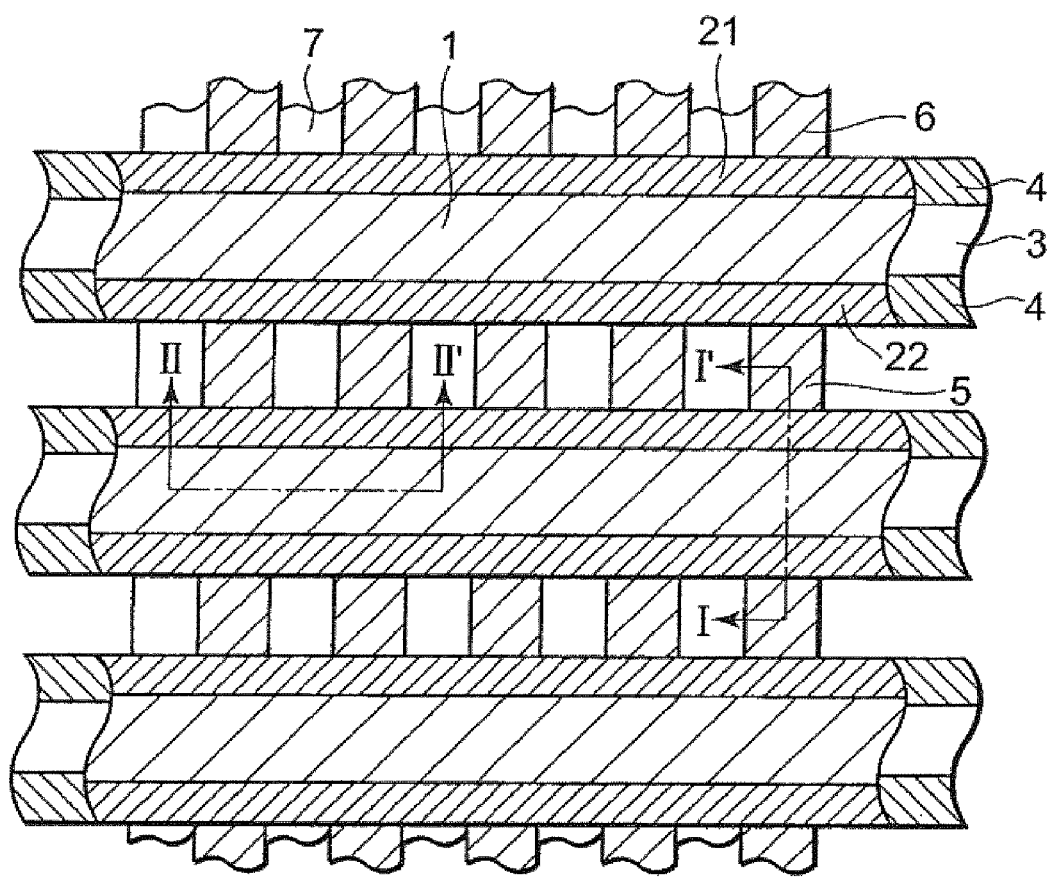
FIG. 10
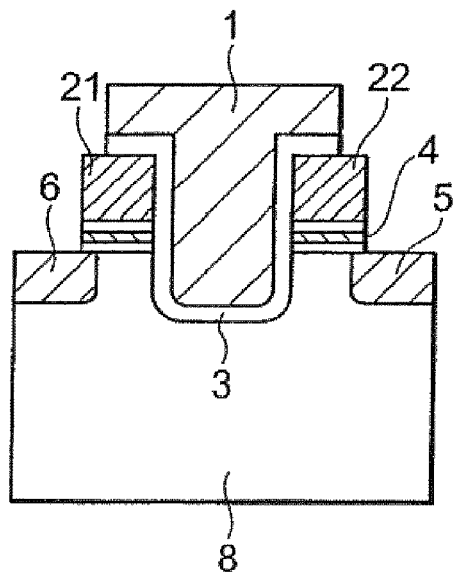
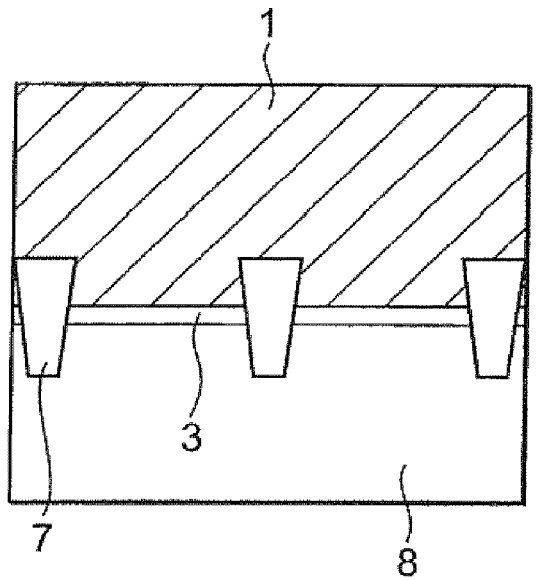
FIG. 11A      FIG. 11B

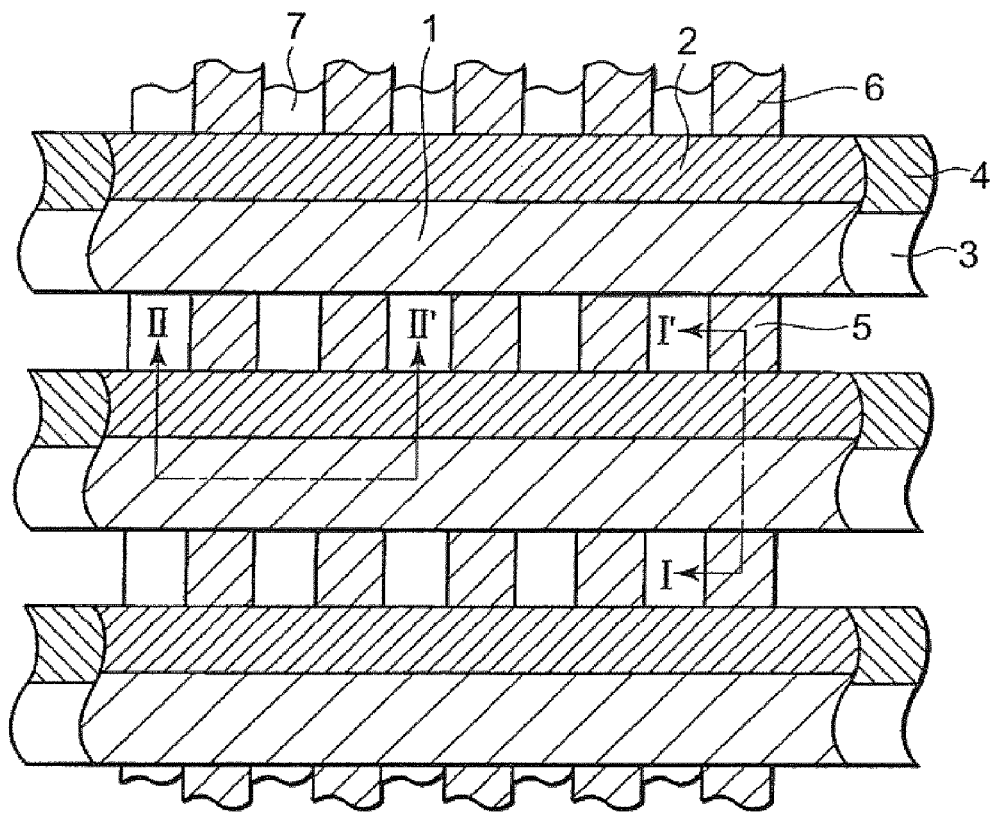
FIG. 18
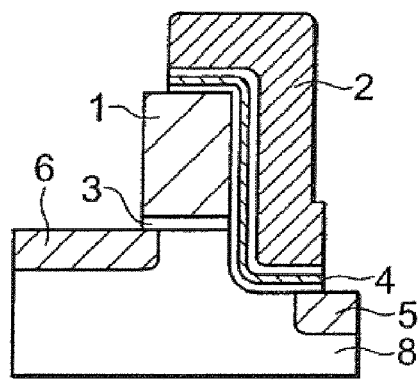 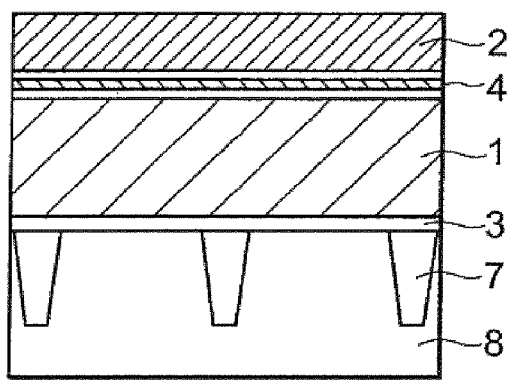
FIG. 19A  FIG. 19B

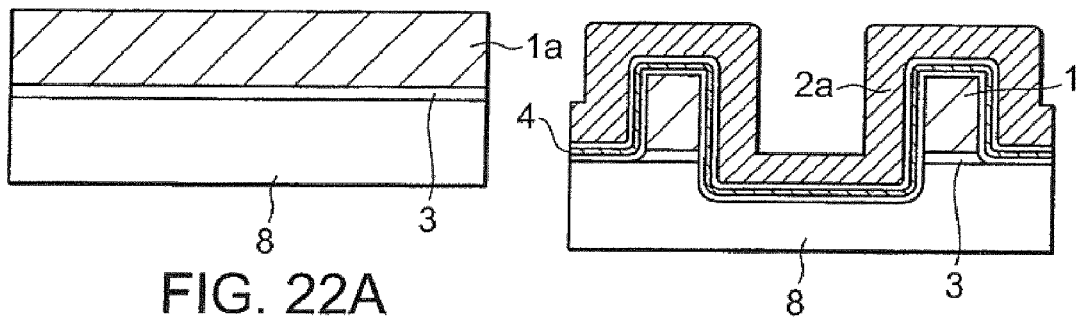
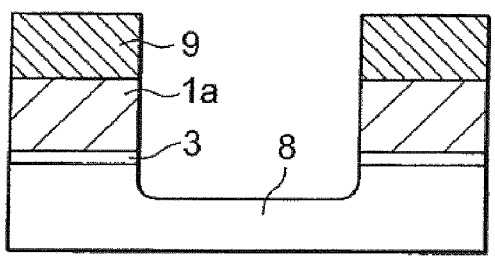
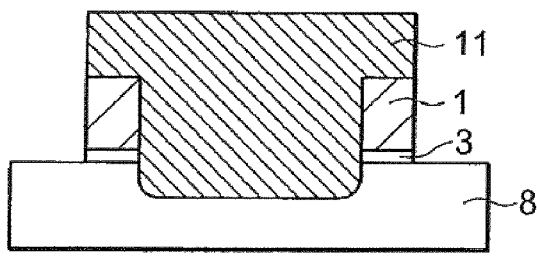
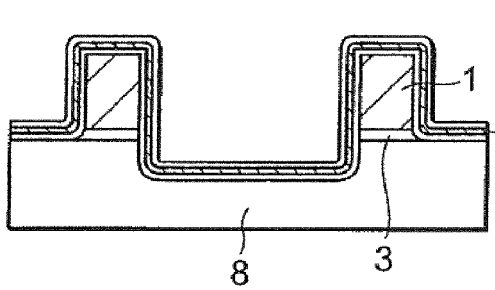
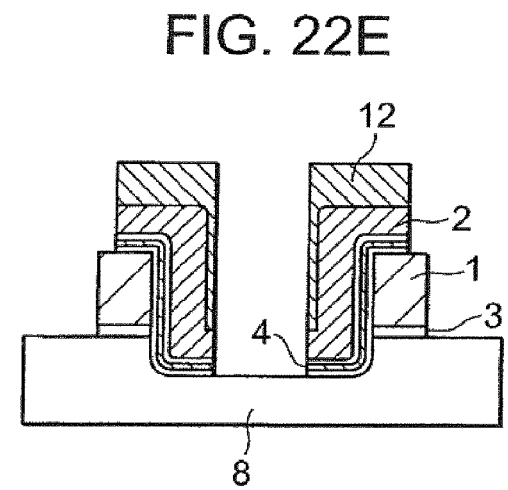
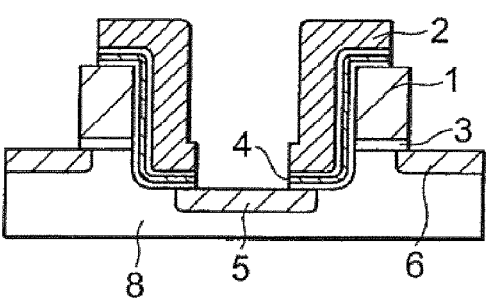
FIG. 22A
FIG. 22B
FIG. 22C
FIG. 22D
FIG. 22E
FIG. 22F
FIG. 22G

SEMICONDUCTOR DEVICE

TECHNICAL FIELD

This invention relates to a semiconductor device and a manufacturing technology thereof. More specifically, this invention relates to a semiconductor device including a rewritable nonvolatile semiconductor memory cell which is called a trap type.

BACKGROUND ART

With regard to flash memories up to the 0.13 μm generation, in order to miniaturize a flash memory, a dominant way of making smaller a flash memory is to make smaller a cell area using a Floating Gate (FG) type or to make thinner an insulating film. However, from the 90 nm generation on, it becomes difficult to make thinner the insulating film in view of securing retention characteristics, and hence a trap type memory which uses as a charge storage layer a trap in an insulating film is attracting attention.

A Twin MONOS (Metal Oxide Nitride Oxide Semiconductor) type storage device is one type of trap type nonvolatile memories (see Japanese Patent Application Laid-Open No. 2005-142600 (Patent Document 1), for example).

FIG. 1 is a plan view of a Twin MONOS type storage device.

As illustrated in FIG. 1, in a Twin MONOS type storage device, a device isolation region 7 is disposed in predetermined regions in a semiconductor substrate to define active regions including source-drain regions 5 and 6. The active regions are crossed by a plurality of word gate electrodes 1. Control gates 21 and 22 (CG1 and CG2) are formed on both sides of the word gate electrode 1 with a trap insulating film 4 sandwiched therebetween. The trap insulating film 4 includes a charge trap layer and is extended between the control gates 21 and 22 and the substrate. A word gate insulating film 3 which does not include a charge trap layer is formed between the gate electrode 1 and the active region.

FIG. 2A and FIG. 2B are sectional views taken along the lines I-I' and II-II', respectively, of FIG. 1.

As illustrated in FIG. 2A and FIG. 2B, there are provided three gate electrodes adjacent to one another and source-drain regions on a silicon substrate 8. The trap insulating film 4 is formed between the control gates 21 and 22 and the silicon substrate 8 and between the control gates 21 and 22 and the word gate electrode 1. The word gate insulating film 3 not including a trap is formed below the word gate electrode 1.

By injecting and storing charge into the trap insulating film 4 below the control gate 21 or the control gate 22 using channel hot electrons, the Twin MONOS type storage device operates as a nonvolatile memory which stores 2 bits per cell. When the state of charge below the control gate 22 is read, the left source-drain region 6 is used as a drain to which a positive voltage is applied. At the same time, a positive voltage is also applied to the control gates 21 and 22 and to the word gate electrode 1. When electrons are stored in the trap insulating film 4 below the control gate 22, the flat band of the control gate 22 fluctuates in a positive direction, and hence it becomes difficult for electrons to pass below the control gate 22. On the other hand, when electrons are not stored in the trap insulating film below the control gate 22, a larger amount of current passes. In order to increase the operation speed of the memory, it is necessary that the read current when the charge is erased be high, but, when the Twin MONOS type structure is used, there is a problem that the read current becomes low.

FIG. 3 illustrates an electronic current Ie when the state of charge stored below the control gate 22 is read and the potential $\phi$ felt by the electrons. Further, electric fields applied from the word gate electrode and the control gates are illustrated by arrows. In this case, for example, 2 V is applied to the word gate electrode 1 and the control gates 21 and 22, 1 V is applied to the source-drain region 6, and ground potential is applied to the source-drain region 5 to carry out reading.

As illustrated in FIG. 3, a gap G which corresponds to the thickness of the trap insulating film exists between the word gate electrode and the control gates, and the electric fields from the word gate electrode and the control gates are difficult to be reached to a channel region corresponding to the gap. Specifically, a potential barrier is generated in the vicinity of the gap between the word gate electrode and the control gates, which makes smaller the electronic current Ie.

On the other hand, a cell structure in which the thickness of an insulating film between a word gate electrode and control gates is set independently of an insulating film below the control gates is proposed (see, for example, Japanese Patent Application Laid-Open No. 2001-230332 (Patent Document 2) and Japanese Patent Application Laid-Open No. 2004-282029 (Patent Document 3)).

In the cell structure, as illustrated in FIG. 4, an insulating film 13 which does not have a charge trap is interposed between the word gate electrode 1 and the control gates 21 and 22. In this case, by making thin the insulating film 13, the potential barrier is reduced to increase on-current. However, by making thin the insulating film between the word gate electrode and the control gates, a capacitance C between the word gate electrode and the control gates is increased, which lowers the switching speed of the control gates and the word gate.

DISCLOSURE OF THE INVENTION

Problem to be Solved by the Invention

An object of this invention is to solve the problems of the conventional art described in the above. An object of this invention is, in a semiconductor device having on a semiconductor substrate a gate electrode formed via a gate insulating film including a charge trap and a gate electrode formed via a gate insulating film not including a charge trap, to prevent a potential barrier against electrons from being formed in a channel layer formed below both of the gate electrodes.

Means to Solve the Problem

In order to achieve the above-mentioned object, according to this invention, there is provided a semiconductor device including: a plurality of gate electrodes formed via an insulating film on a base, at least a surface of the base being formed of a semiconductor layer; a first diffusion layer and a second diffusion layer formed in the semiconductor layer with the plurality of gate electrodes sandwiched therebetween; and a channel layer formed between the first diffusion layer and the second diffusion layer in the semiconductor layer, in which: the insulating film includes a structure in which a plurality of insulating regions are disposed in due order from the first diffusion layer along the channel layer in the semiconductor layer toward the second diffusion layer; at least one insulating region of the plurality of insulating regions includes a charge trap and at least one insulating region of the plurality of insulating regions does not include a charge trap; the plurality of gate electrodes are formed on the base via the plurality of insulating regions, respectively; the plurality of gate electrodes are insulated from adjacent ones of the gate electrodes, respectively; and levels of the channel layer formed below bottoms of the adjacent gate electrodes are different from each other.

Further, in order to achieve the above-mentioned object, according to this invention, there is provided a semiconductor device including: a gate electrode group including first to third gate electrodes adjacent to one another and arranged in ascending numeric order, the gate electrode group being formed via an insulating film on a base so as to be extended in a first direction, at least a surface of the base being formed of a semiconductor layer, and a plurality of the gate electrode groups being formed so as to be arranged in a second direction orthogonal to the first direction; a plurality of first diffusion layers and a plurality of second diffusion layers formed in the semiconductor layer so as to be lined in the first direction with the gate electrode group sandwiched therebetween; a channel layer formed between the first diffusion layer and the second diffusion layer in the semiconductor layer; and a plurality of device isolation layers extended in the second direction and formed so as to be arranged in the first direction, in which: the insulating film includes a structure in which a first insulating region including a charge trap, a second insulating region not including a charge trap, and a third insulating region including a charge trap are disposed in this order from the first diffusion layer along the channel layer in the semiconductor layer toward the second diffusion layer; the first gate electrode is formed on the base via the first insulating region, the second gate electrode is formed via the second insulating region, and the third gate electrode is formed via the third insulating region; the first to third gate electrodes are insulated from adjacent ones of the gate electrodes, respectively; and levels of the channel layer formed below bottoms of the adjacent gate electrodes are different from each other.

Further, in order to achieve the above-mentioned object, according to this invention, there is provided a semiconductor device including a first gate electrode and a second gate electrode formed via an insulating film on a base, at least a surface of the base being formed of a semiconductor layer; a first diffusion layer and a second diffusion layer formed in the semiconductor layer with the first and second gate electrodes sandwiched therebetween; and a channel layer formed between the first diffusion layer and the second diffusion layer in the semiconductor layer, in which: the insulating film includes a structure in which a first insulating region and a second insulating region are disposed in this order from the first diffusion layer along the channel layer in the semiconductor layer toward the second diffusion layer, one of the first and second insulating regions includes a charge trap; the first gate electrode is formed on the base via the first insulating region and the second gate electrode is formed via the second insulating region; the first and second gate electrodes are insulated from each other; and levels of the channel layer formed below bottoms of the first and second gate electrodes are different from each other.

EFFECT OF THE INVENTION

According to this invention, a step is formed in a portion of a channel region at which the two gate electrodes are adjacent to each other, and electric fields from both of the gate electrodes are adapted to be applied to the step portion with the distance therebetween being at the minimum. Therefore, a potential barrier is prevented from being formed at the portion at which the two gate electrodes are adjacent to each other, and thus, lowering of the read current can be suppressed.

Further, the effective channel length is extended, and hence increase of a punch through current generated when the length of the gate electrodes is made smaller can be suppressed. Therefore, the on/off ratio of the read current can be made larger.

BRIEF DESCRIPTION OF THE DRAWINGS

FIG. 10 is a plan view of Example 2 of this invention.

FIG. 11A is a sectional view taken along the line I-I' of FIG. 10.

FIG. 11B is a sectional view taken along the line II-II' of FIG. 10.

FIG. 18 is a plan view of Example 5 of this invention.

FIG. 19A is a sectional view taken along the line I-I' of FIG. 18.

FIG. 19B is a sectional view taken along the line II-II' of FIG. 18.

FIGS. 22A to 22G are sectional views illustrating manufacturing steps in due order of a manufacturing method of Example 6 of this invention.

BEST MODE FOR EMBODYING THE INVENTION

Next, embodiments of this invention are described in detail with reference to the drawings.

Figure 1:
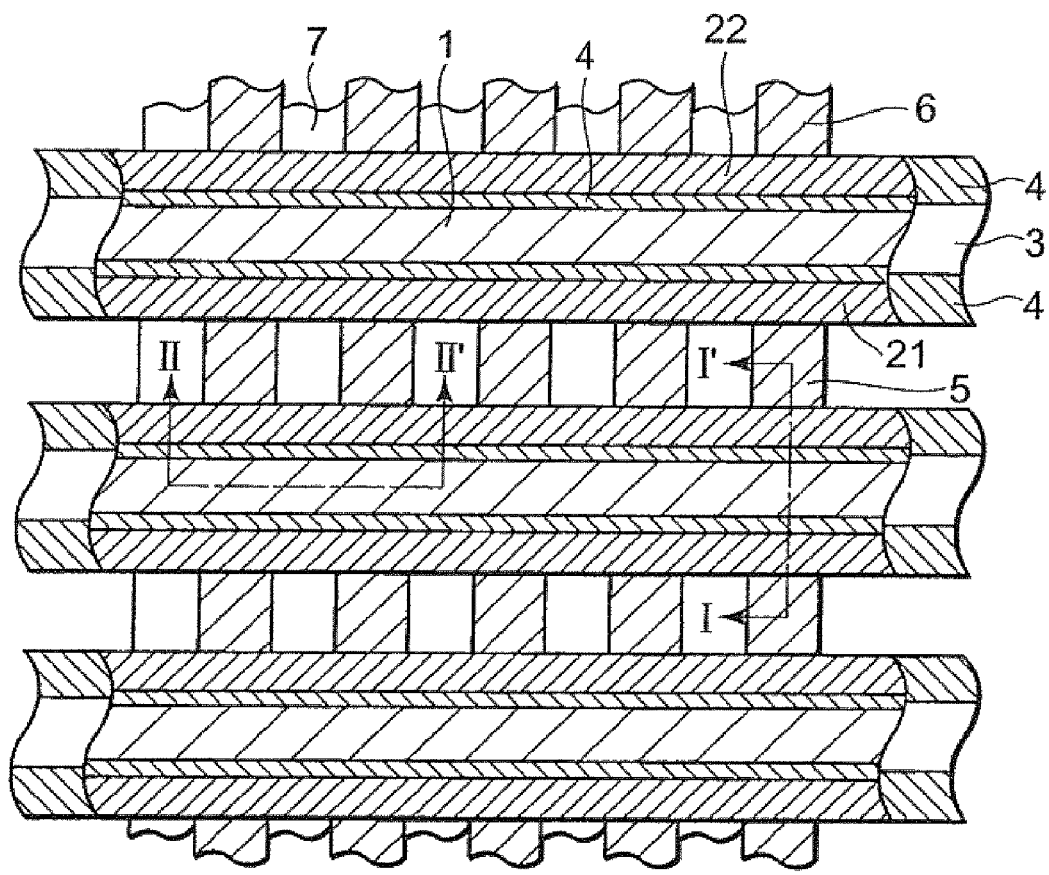
FIG. 1 is a plan view for describing a Twin MONOS type semiconductor storage device of related art.
Figures 2A, 2B:
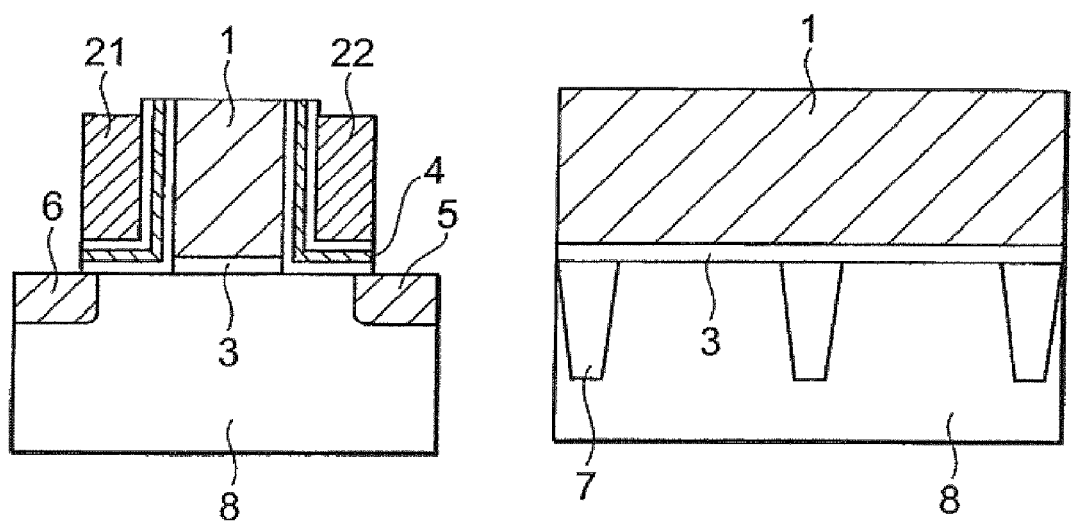
FIG. 2A is a sectional view taken along the line I-I' of FIG. 1.
FIG. 2B is a sectional view taken along the line II-II' of FIG. 1.
Figure 3:
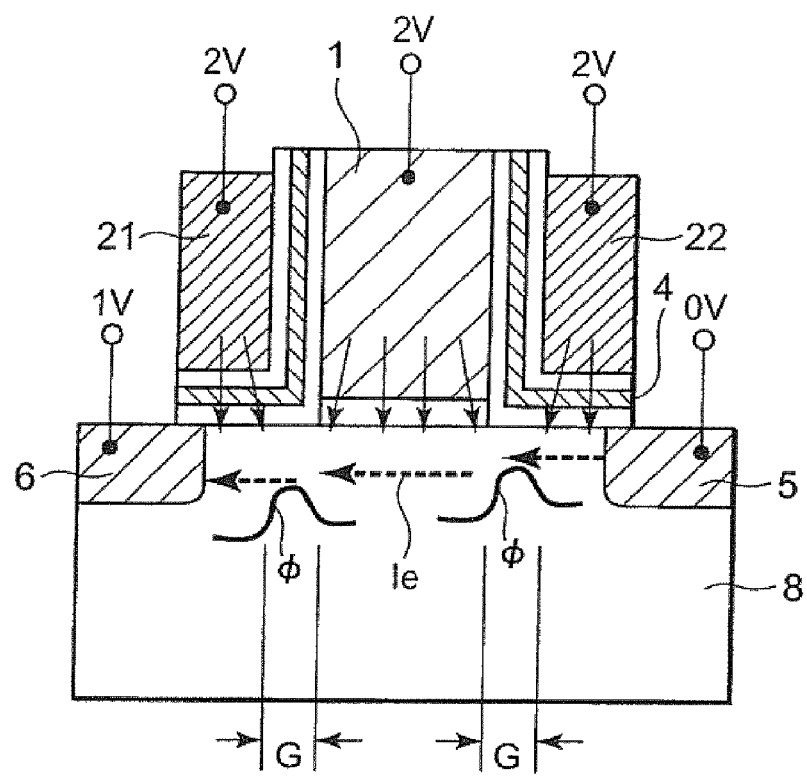
FIG. 3 is a view for describing operation of the related art.
Figure 4:
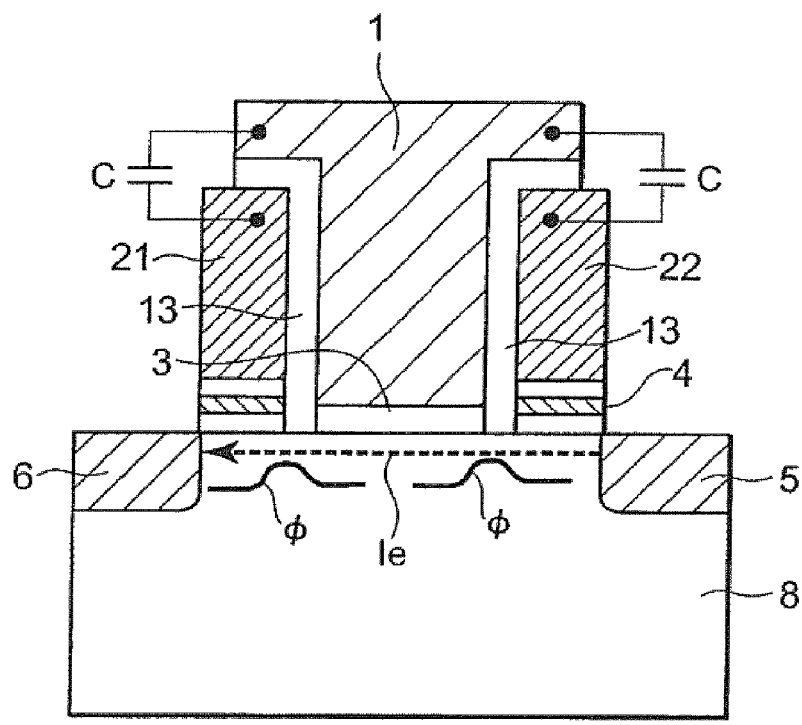
FIG. 4 is a sectional view illustrating another related art.
Figure 5A:
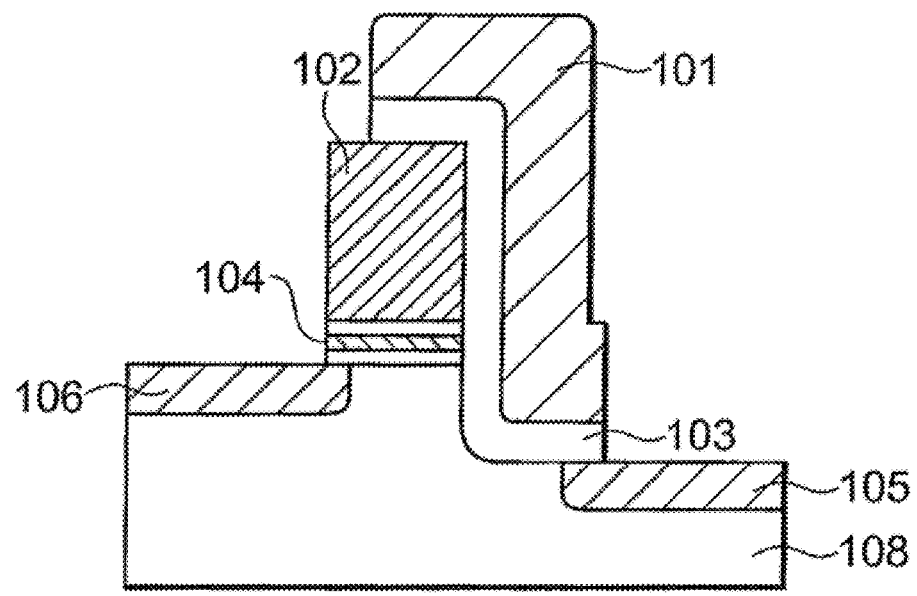
FIGS. 5A and 5B are sectional views for describing embodiments of this invention.

FIG. 5A is a sectional view illustrating a first embodiment of this invention.

As illustrated in FIG. 5A, source-drain regions 105 and 106 are formed in a surface region of a semiconductor substrate 108. On the semiconductor substrate between the source-drain regions 105 and 106, a word gate electrode 101 is formed via a word gate insulating film 103 not including a charge storage layer and a control gate 102 is formed via a trap insulating film 104 including a charge storage layer. The word gate insulating film 103 insulates between the word gate electrode 101 and the control gate 102. This invention is characterized in that there is a level difference between a channel layer formed below the word gate electrode 101 and a channel layer formed below the control gate 102.

In the first embodiment illustrated in FIG. 5A, the level of the bottom of the word gate electrode 101 is made lower than the level of the bottom of the control gate 102. The level difference is made to be larger than the thickness of the trap insulating film 104. In other words, the level of the channel layer formed below the bottom of the word gate electrode 101 is made to be lower than the level of the channel layer formed below the bottom of the control gate 102, and the level difference is made to be larger than the thickness of the word gate insulating film 103. This makes an electric field applied from a side surface of the word gate electrode 101 to a side surface of the step on a surface of the semiconductor substrate, which can prevent a potential barrier against electrons from being formed in the channel region.

Figure 5B:
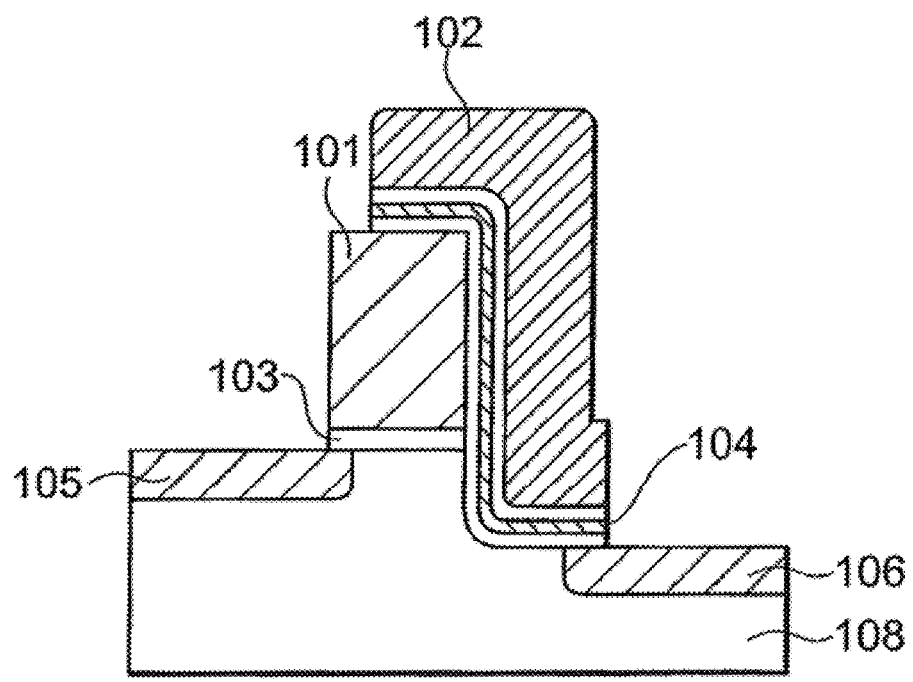

FIG. 5B is a sectional view illustrating a second embodiment of this invention.

As illustrated in FIG. 5B, source-drain regions 105 and 106 are formed in a surface region of a semiconductor substrate 108. On the semiconductor substrate between the source-drain regions 105 and 106, a word gate electrode 101 is formed via a word gate insulating film 103 not including a charge storage layer and a control gate 102 is formed via a trap insulating film 104 including a charge storage layer. The trap insulating film 104 insulates between the word gate electrode 101 and the control gate 102. In this embodiment, contrary to the case of the first embodiment illustrated in FIG. 5A, the level of the bottom of the word gate electrode 101 is made to be higher than the level of the bottom of the control gate 102, and the level difference is made to be larger than the thickness of the word gate insulating film 103.

In other words, the level of a channel layer formed below the bottom of the word gate electrode 101 is made to be higher than the level of the channel layer formed below the bottom of the control gate 102, and the level difference is made to be larger than the thickness of the trap insulating film 104. This makes an electric field applied from a side surface of the control gate 102 to a side surface of the step on a surface of the semiconductor substrate, which can prevent a potential barrier against electrons from being formed in the channel region.

The amount of the read current depends on the potential felt by the electrons. The potential felt by the electrons is mainly determined by the physical thickness and the permittivity of each insulating film, and hence a region in which the potential is discontinuous may be generated on a boundary between adjacent insulating films. A region in which the potential is discontinuous prevents smooth flow of carriers and lowers the read current, and hence in order to fully enjoy the effect of this invention, it is necessary to determine the physical thicknesses and the permittivities of the adjacent insulating films such that the read current is not lowered due to discontinuous potential. In examples described in the following, also, the physical thicknesses and the permittivities were determined so as to satisfy this condition.

Figure 6A:
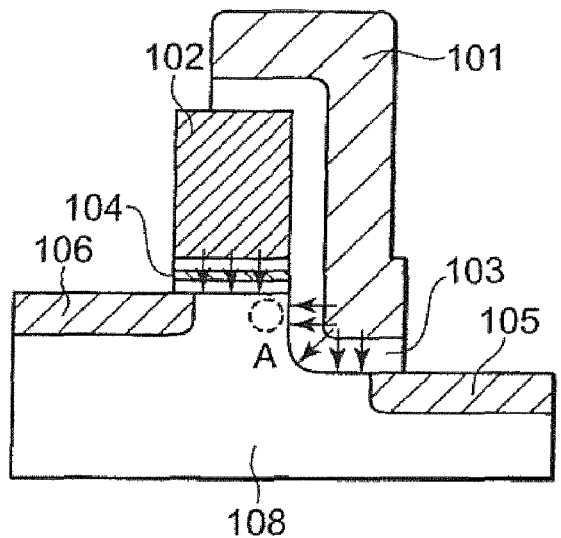
FIGS. 6A to 6D are sectional views for describing operation and modifications of the embodiments of this invention.
Figure 6B:
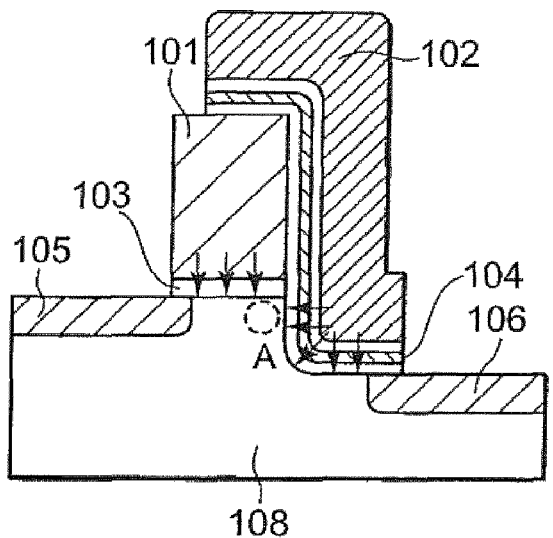

The states of application of electric fields from the gate electrodes to the channel region in reading in the memory cells according to the first and second embodiments are illustrated in FIG. 6A and FIG. 6B, respectively.

As illustrated in FIG. 6A, in the memory cell of the first embodiment, an electric field is applied from the bottom of the control gate 102 toward the channel region in a vertical direction. On the other hand, an electric field is applied from the bottom of the word gate electrode 101 toward the channel region in the vertical direction, and at the same time, an electric field is applied from a side surface of the word gate electrode 101 in a horizontal direction. As a result, the electric fields from the two gate electrodes are applied to the vicinity of a region A illustrated by a dotted circle, and thus, the potential barrier generated in the vicinity of the boundary between the two gate electrodes in the related art is prevented from being formed, and a large read current can be obtained with regard to a memory cell in a state in which stored charge is erased.

Similarly, in the memory cell of the second embodiment, also, as illustrated in FIG. 6B, electric fields from the two gate electrodes are applied to the vicinity of a region A, and thus, the potential barrier is prevented from being formed, and a large read current can be obtained with regard to a memory cell in a state in which stored charge is erased.

However, in the memory cell structure of the first embodiment of this invention, when edges of the word gate electrode 101 and of the word gate insulating film 103 at the bottom on the side closer to the control gate are formed so as to form a right angle, the distance from the gate electrode 101 to the channel region at the edge is $\sqrt{2}$ times as much as the thickness of the word gate insulating film 103, and the electric field applied here from the gate electrode becomes weaker. More specifically, a potential barrier, albeit weak, is newly generated. In order to alleviate this, it is preferable that the edge be chamfered or rounded such that the distance between the gate electrode and the channel region is less than $\sqrt{2}$ times as much as the thickness of the word gate insulating film 103. Another way to alleviate the potential barrier is to extend a tip of the source-drain region 105 to the side closer to the control gate 102.

Figure 6C:
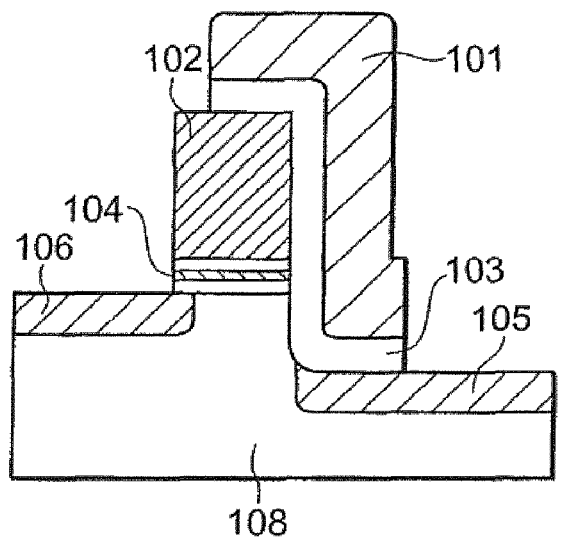

As illustrated in FIG. 6C, by extending the source-rain region 105 beyond a position at which the word gate insulating film 103 begins to make an upward turn, the potential barrier can be suppressed. In other words, an extension is made such that the shortest distance between a surface of the semiconductor substrate at the tip of the source-drain region 105 and the word gate electrode 101 is larger than the thickness of the word gate insulating film 103. If the tip of the source-drain region 105 is further extended to immediately below the control gate 102, even if the edges of the word gate insulating film 103 and of the word gate electrode 101 are not rounded, the potential barrier can be substantially eliminated.

Similarly, in the memory cell of the second embodiment illustrated in FIG. 5B, by chamfering or rounding edges of the control gate 102 and of the trap insulating film 104 bordering the channel region, the potential barrier in the channel region in contact with the edges can be suppressed. Alternatively, by extending a tip of the source-drain region 106 beyond a position at which the trap insulating film 104 begins to make an upward turn to the side of the word gate electrode 101, the effect of the potential barrier can be alleviated.

Figure 6D:
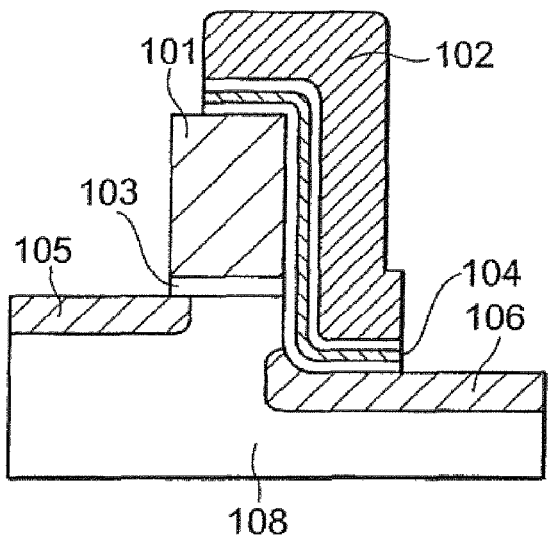

Further alternatively, as illustrated in FIG. 6D, by extending the tip of the source-drain region 106 to a position immediately below the word gate electrode 101, the effect of the potential barrier can be alleviated. In this case, the corners of the trap insulating film 104 and of the control gate 102 are not required to be rounded as illustrated in FIG. 6D. However, when the source-drain region 5 or 6 is extended to immediately below the control gate 102 or the word gate electrode 101 in this way, leakage current between the source-drain regions 5 and 6 may be increased. For this reason, it is preferable that the impurity concentration between the source-drain regions 5 and 6 be made to be higher than the impurity concentration in the channel forming region immediately below the control gate 102 or immediately below the word gate electrode 101.

In the memory cell of this invention, the potential barrier generated in the memory cell of the related art is eliminated by providing a level difference in the channel layer. On the other hand, in the cell structure, a channel current passes not only in the horizontal direction but also in the vertical direction and the channel is spatially formed, and thus, the channel length is substantially made larger and the possibility of occurrence of punch through, which is becoming serious by making finer the gate electrode length, can be alleviated. Therefore, the on/off ratio of the read current, which is made smaller by a punch-through current, can be kept large. As the step on the surface of the substrate becomes larger, the effect of preventing punch-through becomes greater.

The cell structures illustrated as embodiments of this invention have two gate electrodes and are referred to as a so-called split-ate cell structure. However, the cell structure may be a three gate electrode structure (Twin MONOS) in which a control gate is formed on each side of a word gate electrode, and the number of the gate electrodes in the memory cell of this invention is not specifically limited. An important point in the memory cell of this invention is that there is a step between the surface of the substrate below a gate electrode formed via a gate insulating film not including a charge trap and the surface of the substrate below a gate electrode formed via a gate insulating film including a charge trap, the gate electrodes being adjacent to each other.

As the word gate insulating film 103 not including a charge trap, a silicon oxide film, a silicon oxynitride film, or a lamination film thereof is used. The trap insulating film 104 is typically a three-layer film of an insulating film not including a charge trap/an insulating film including a charge trap, and an insulating film not including a charge trap, and a silicon oxide film/a silicon nitride film/a silicon oxide film represented as O/N/O is used, but this invention is not limited thereto. For example, instead of the silicon nitride film of the O/N/O, a film of any one of silicon oxynitride, alumina, aluminum silicate, hafnium oxide, and hafnium silicate may also be used. Further, as the trap insulating film 104, a single-layer silicon oxide film having localized metal, nano-crystalline silicon, or the like to be a charge trap in a middle portion thereof may also be used.

In the second embodiment in which a channel in the vertical direction is formed so as to be in contact with the trap insulating film 104, it is preferable that a (100) surface, a (311) surface, or a surface which is crystallographically equivalent thereto appear on a vertical surface of the substrate. This can decrease leakage of a charge from the trap insulating film, and the retention characteristics of the stored charge can be satisfactorily maintained. This is because the interface state density of an oxide film formed on a surface of a wafer differs depending on the plane orientation of the wafer. The magnitude relationship of the interface state densities is (110)>(111)>>(100)>(311). In other words, by modification of the interface between an underlayer film of the trap insulating film 104 and the substrate, leakage of the stored charge can be decreased.

When the memory cell of this invention is read, a positive voltage is applied to the word gate electrode 101 and the control gate 102. At the same time, a positive voltage is applied to the source-drain region 105 on the side of the word gate electrode 101 to make the source-drain region 105 operate as a drain while a ground voltage is applied to the source-drain region 106 on the side of the control gate 102 to make the source-drain region 106 operate as a source. Here, when electrons are stored in the trap insulating film 104, it becomes difficult for an electronic current to flow between the source and the drain. When electrons are not stored, a channel is formed between the source and the drain and a large electronic current flows. Therefore, by reading an electronic current value when a predetermined voltage is applied, the state of writing to the trap insulating film 104 can be detected.

Writing is carried out by applying a positive voltage to the source-drain region 106, the control gate 102, and the word gate electrode 101 to generate channel hot electrons below the control gate 102 and injecting the electrons into the trap insulating film 104.

Erasing is carried out by applying a positive voltage to the source-drain region 106, applying a negative voltage to the control gate 102, and injecting generated hot holes into the trap insulating film 104. Contrary to this, erasing may also be carried out by pulling out electrons to the source-drain region 106 or to the substrate.

EXAMPLE 1

Figure 7:
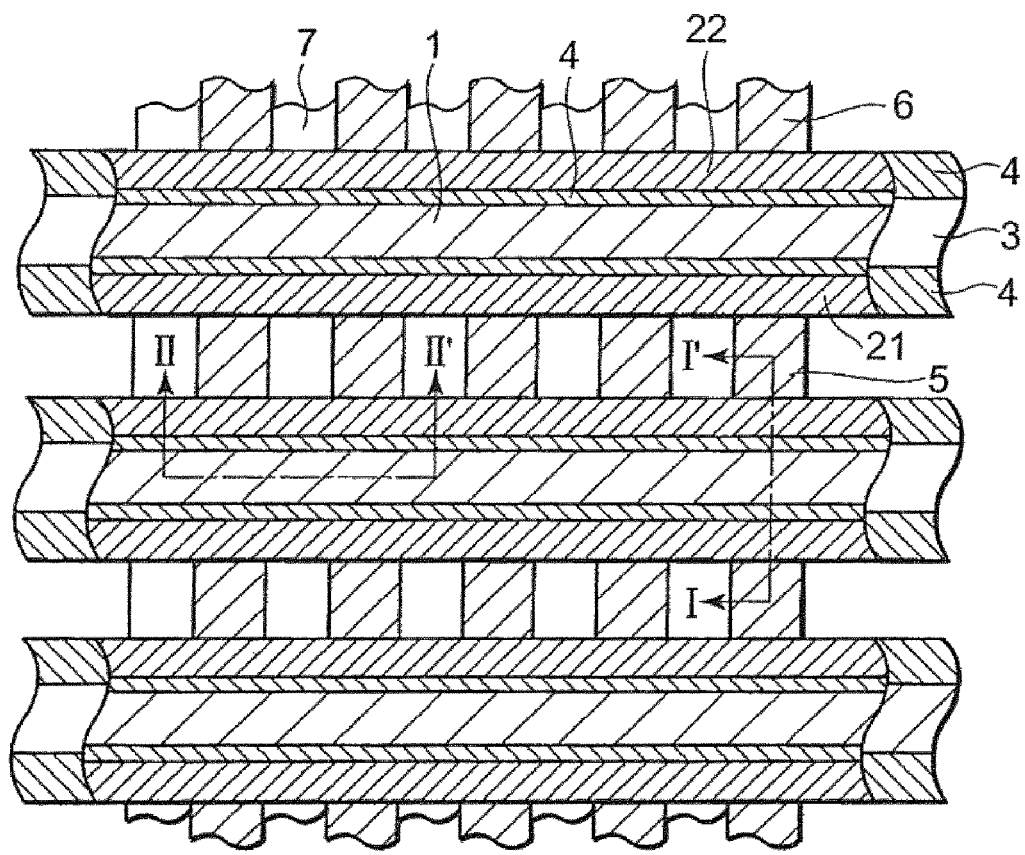
FIG. 7 is a plan view of Example 1 of this invention.

FIG. 7 is a plan view of a semiconductor storage device according to Example 1 of this invention, which is, here, a Twin MONOS storage device.

As illustrated in FIG. 7, in the storage device of this example, a device isolation region 7 is disposed in predetermined regions of a semiconductor substrate to define active regions including source-drain regions 5 and 6 and a channel region. The active regions are crossed by a plurality of word gate electrodes 1 and control gates 21 and 22. There is interposed a word gate insulating film 3 not including a charge storage layer between the word gate electrode 1 and the active region while there is interposed a trap insulating film 4 including a charge storage layer between the control gates 21 and 22 and the active region.

Figure 8A:
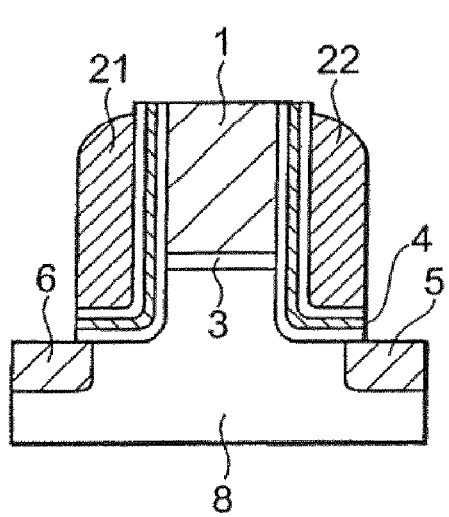
FIG. 8A is a sectional view taken along the line I-I' of FIG. 7.
Figure 8B:
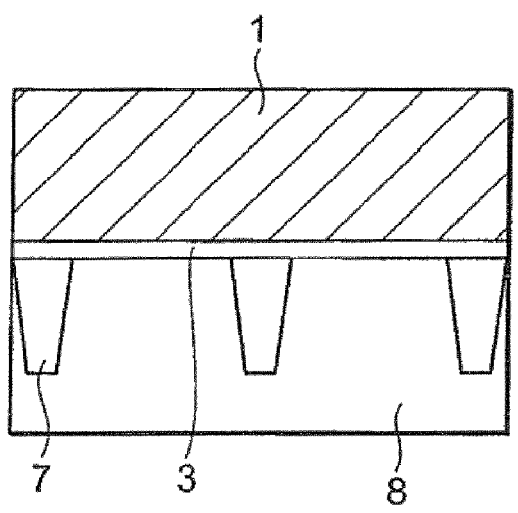
FIG. 8B is a sectional view taken along the line II-II' of FIG. 7.

FIG. 8A and FIG. 8B are sectional views taken along the lines I-I' and II-II' of FIG. 7, respectively, which illustrate the storage device according to this example.

In the storage device of this example, the source-drain regions 5 and 6 of n conductive type is formed on a silicon substrate 8 of p conductive type including the device isolation region 7 with a channel forming region sandwiched therebetween, and the word gate electrode 1 is formed on the channel forming region between the source-drain regions 5 and 6 via the word gate insulating film 3. The control gate 21 is formed on one side of the word gate electrode 1 via the trap insulating film 4 and is formed on the silicon substrate 8 via the trap insulating film 4. Further, the control gate 22 is formed on the other side of the word gate electrode 1 via the trap insulating film 4 and is formed on the silicon substrate 8 via the trap insulating film 4. Here, the storage device of this invention is characterized in that there is a level difference between the bottom of the word gate electrode 1 and the bottoms of the control gate 21 and the control gate 22. Here, the bottom of the word gate electrode 1 is made to be higher than the bottoms of the control gate 21 and of the control gate 22, and the level difference between the bottoms of the electrodes is made to be larger than the physical thickness of the word gate insulating film 3.

What is more, it is desirable that, from the viewpoint of the manufacture, the levels of the source-drain regions 5 and 6 be equal to each other. This is because, when the source-drain regions are etched in order to form therein contact holes from a wiring layer, if the levels of the source-drain regions are different, etching of the higher region is completed earlier, and the higher region is damaged more than the lower region by overetching.

In this example, the trap insulating film 4 had a three layer lamination structure of a silicon oxide film/a silicon nitride film/a silicon oxide film. Further, the word gate insulating film 3 was formed of silicon oxide.

A manufacturing method of Example 1 of this invention is briefly described in the following. FIGS. 9A to 9G are sectional views illustrating the manufacturing method of Example 1 in due order of manufacturing steps, which are taken along the line I-I' of FIG. 7.

Figure 9A:
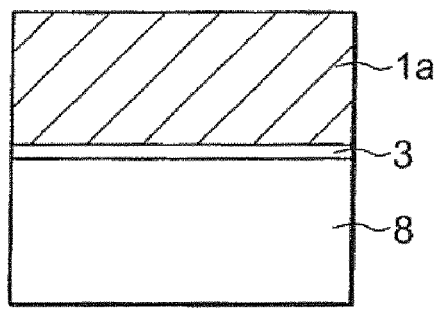
FIGS. 9A to 9G are sectional views illustrating manufacturing steps in due order of a manufacturing method of Example 1 of this invention.

First, as illustrated in FIG. 9A, the word gate insulating film 3 formed of a silicon oxide film was formed by thermal oxidation on the silicon substrate 8 in which the principal surface was a (100) surface, and polysilicon doped with phosphorus was deposited to form a word gate electrode material layer 1*a*.

Figure 9B:
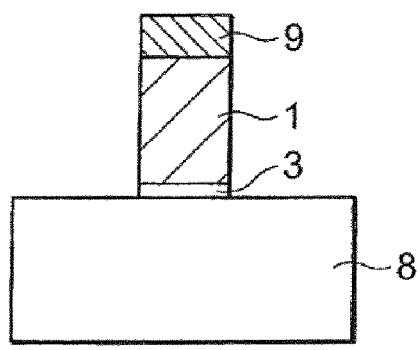

Then, as illustrated in FIG. 9B, a patterned resist mask 9 was formed and dry etching was carried out to process the word gate electrode material layer 1*a* into the word gate electrode 1. Further, by removing the exposed word gate insulating film 3, the surface of the silicon substrate 8 was exposed.

Figure 9C:
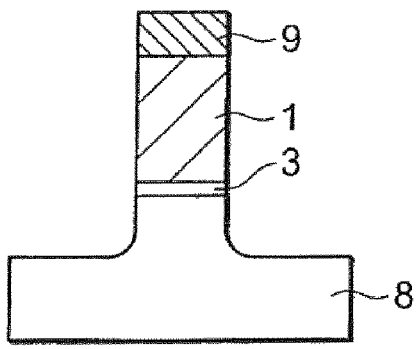

Then, as illustrated in FIG. 9C, additional dry etching was carried out with the resist mask 9 being used as a mask and the silicon substrate 8 was digged to expose a (010) surface. The amount of digging the silicon substrate 8 was equal to or larger than the thickness of the word gate insulating film 3 and the thickness of the trap insulating film to be formed later. After the additional dry etching, the resist mask 9 was removed in a wet process.

Figure 9D:
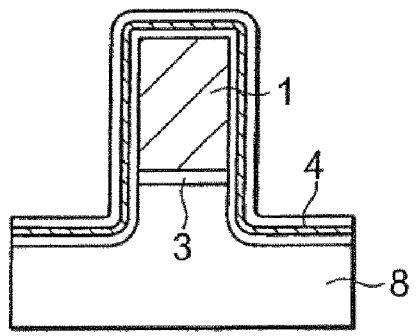

Then, as illustrated in FIG. 9D, by oxidizing the entire surface; an underlayer oxide film of the trap insulating film was formed. By depositing thereon a silicon nitride film to be a charge storage layer using the chemical vapor deposition (CVD) method, and further, oxidizing the surface of the silicon nitride film, the trap insulating film 4 having a three layer structure of a silicon oxide film/a silicon nitride film/a silicon oxide film was formed. It should be noted that, in the oxidation, radical oxidation or the like in which the oxidation rate depends less on the plane orientation is preferably used, and in situ steam generation (ISSG) oxidation was used here.

Figure 9E:
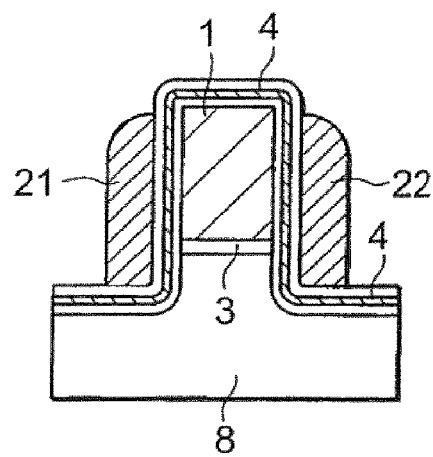

Then, as illustrated in FIG. 9E, by depositing polysilicon doped with phosphorus on the entire surface and carrying out etching back in a dry process, the control gates 21 and 22 were formed.

Figure 9F:
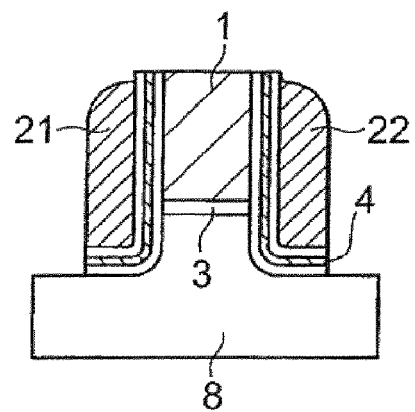

Next, as illustrated in FIG. 9F, an exposed portion of the trap insulating film 4 was removed by dry etching.

Figure 9G:
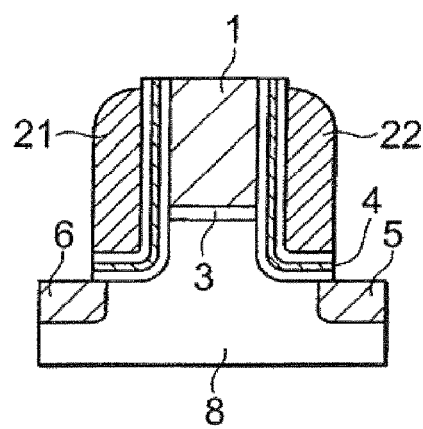

Finally, as illustrated in FIG. 9G, by carrying out ion implantation, the source-drain regions 5 and 6 were formed. After that, a wiring process including deposition of an interlayer insulating film and provision of contact holes was carried out.

EXAMPLE 2

FIG. 10 is a plan view of a semiconductor storage device according to Example 2 of this invention, which is, here, a Twin MONOS storage device.

As illustrated in FIG. 10, in the storage device of this example, a device isolation region 7 is disposed in predetermined regions of a semiconductor substrate to define active regions including source-drain regions 5 and 6 and a channel region. The active regions are crossed by a plurality of word gate electrodes 1 and control gates 21 and 22. There is interposed a word gate insulating film 3 not including a charge storage layer between the word gate electrode 1 and the active region while there is interposed a trap insulating film 4 including a charge storage layer between the control gates 21 and 22 and the active region.

FIG. 11A and FIG. 11B are sectional views taken along the lines I-I' and II-II' of FIG. 10, respectively.

In the semiconductor storage device of this example, as illustrated in FIG. 11A and FIG. 11B, the source-drain regions 5 and 6 which are impurity diffusion layers of n conductive type are formed on a silicon substrate 8 of p conductive type including a device isolation region 7 with a channel forming region sandwiched therebetween, while the word gate electrode 1 is formed on the channel forming region via the word gate insulating film 3 not including a charge storage layer. The control gate 21 is formed on one side of the word gate electrode 1 via the word gate insulating film 3 and is formed on the channel forming region via the trap insulating film 4. The control gate 22 is formed on the other side of the word gate electrode 1 via the word gate insulating film 3 and is formed on the channel forming region via the trap insulating film 4 including a charge storage layer. In this example, the level of the bottoms of the control gate 21 and the control gate 22 are made to be higher than the level of the bottom of the word gate electrode, and, for the purpose of making the electric field applied from the electrodes to the channel the maximum in the vicinity of the boundary between the word gate 1 and the control gates 21 and 22, the level difference is made to be larger than the physical thickness of the trap insulating film 4.

What is more, it is desirable that, from the viewpoint of the manufacture, the levels of the source-drain regions be equal to each other. This is because, when the source-drain regions are etched in order to form contact holes in the interlayer insulating film, if the levels of the source-drain regions are different, etching of the higher region is completed earlier, and the higher region is damaged more than the lower region by overetching.

In this example, the trap insulating film 4 had a three layer lamination structure of a silicon oxide film/a silicon nitride film/a silicon oxide film. Further, silicon oxide was used for the word gate insulating film 3.

A manufacturing method of Example 2 of this invention is briefly described in the following. FIGS. 12A to 12H are sectional views illustrating the manufacturing method of Example 2 in due order of manufacturing steps, which are taken along the line I-I' of FIG. 10.

Figure 12A:
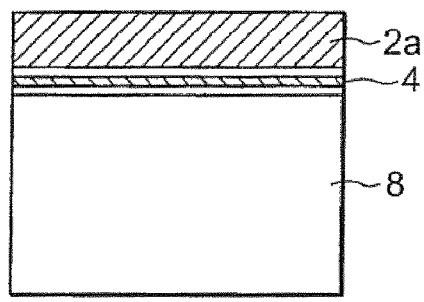
FIGS. 12A to 12H are sectional views illustrating manufacturing steps in due order of a manufacturing method of Example 2 of this invention.

First, as illustrated in FIG. 12A, by oxidizing the entire surface of the silicon substrate 8, an underlayer oxide film of the trap insulating film was formed. By depositing thereon a silicon nitride film to be a charge storage layer using the chemical vapor deposition (CVD) method, and further, oxidizing the surface of the silicon nitride film, the trap insulating film 4 having a three layer structure of a silicon oxide film/a silicon nitride film/a silicon oxide film was formed. It should be noted that, in the oxidation, in situ steam generation (ISS) oxidation was used. After that, a film of polysilicon doped with phosphorus was formed to form a control gate material layer 2*a*.

Figure 12E:
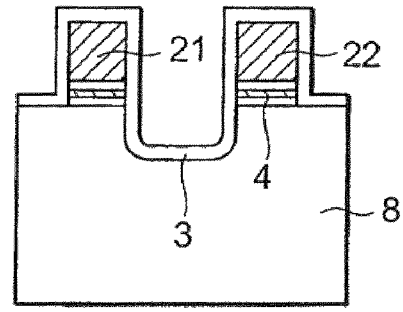
Figure 12B:
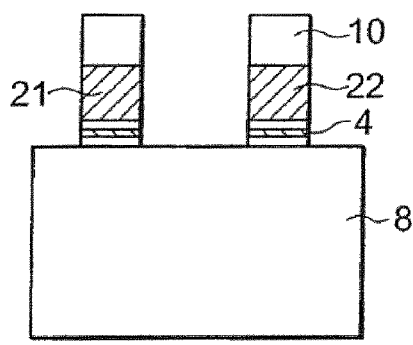

Then, as illustrated in FIG. 12B, a pair of patterned hard masks 10 were formed. By, using the pair of patterned hard masks 10 as masks, carrying out dry etching of the control gate material layer 2*a*, the control gates 21 and 22 were formed. Further, the trap insulating film was removed by dry etching to expose the surface of the silicon substrate 8.

Figure 12F:
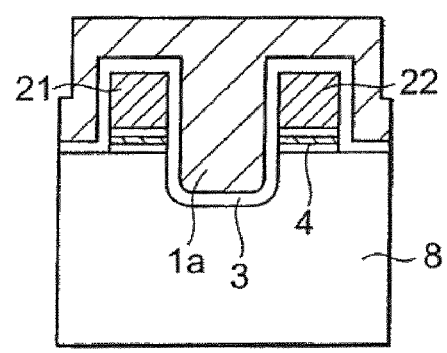
Figure 12C:
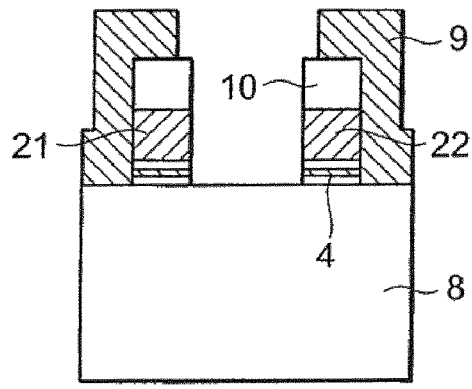

Then, as illustrated in FIG. 12C, resist masks 9, which were patterned so as to cover at least outer sides of the control gates 21 and 22 and ride on the control gates 21 and 22, were formed.

Figure 12G:
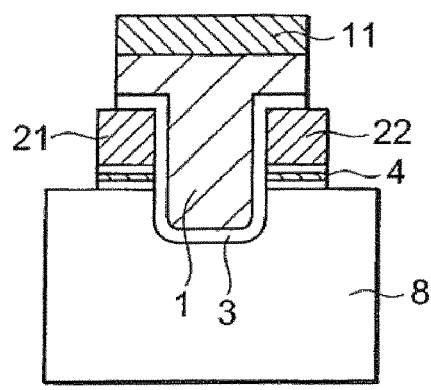
Figure 12D:
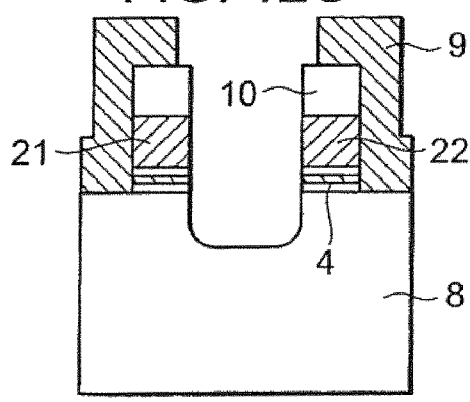

Then, as illustrated in FIG. 12D, dry etching was carried out using the resist masks 9 and the hard masks 10 as an etching stop layer to dig the silicon substrate 8. The amount of digging the silicon substrate 8 from a principal surface was equal to or larger than the thickness of the trap insulating film 4 and the thickness of the word gate insulating film to be formed later. After the dry etching, the resist masks 9 and the hard masks 10 were removed in a wet process.

Then, as illustrated in FIG. 12E, the surface was oxidized to form the word gate insulating film 3. It should be noted that, in the oxidation, radical oxidation or the like in which the oxidation rate depends less on the plane orientation is preferably used. Here, ISSG oxidation was used.

Then, as illustrated in FIG. 12F, polysilicon doped with phosphorus was deposited on the entire surface to form a word gate material layer 1a.

Next, as illustrated in FIG. 12G, dry etching was carried out using a patterned resist mask 11 as an etching stop layer, the word gate electrode 1 was formed so as to ride on the control gates 21 and 22 in a pair and cover an entire groove portion of the silicon substrate 8, and then, the exposed word gate insulating film 3 was removed by dry etching.

Figure 12H:
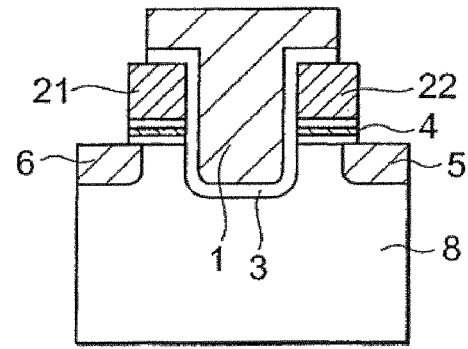

Finally, as illustrated in FIG. 12H, by carrying out ion implantation, the source-drain regions 5 and 6 were formed. After that, a wiring process including deposition of an interlayer insulating film and provision of contact holes was carried out.

EXAMPLE 3

Figure 13:
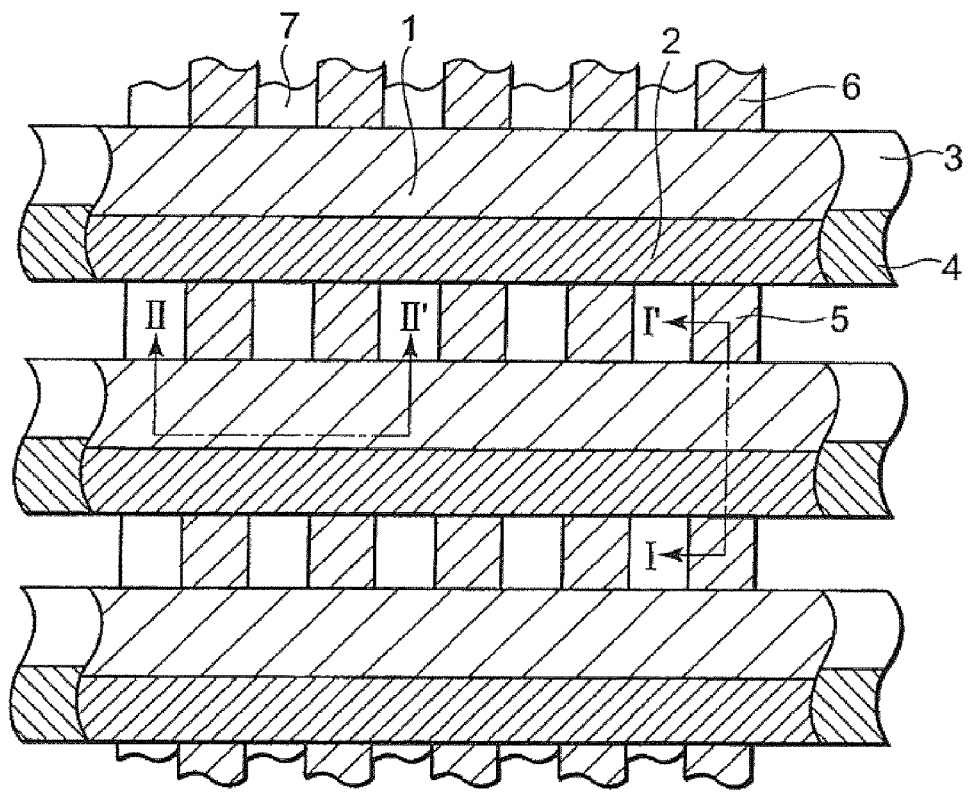
FIG. 13 is a plan view of Example 3 of this invention.

FIG. 13 is a plan view of a semiconductor storage device according to Example 3 of this invention. As illustrated in FIG. 13, in the storage device of this example, a device isolation region 7 is disposed in predetermined regions of a semiconductor substrate to define active regions including source-drain regions 5 and 6 and a channel region. The active regions are crossed by a plurality of word gate electrodes 1 and control gates 2. There is interposed a word gate insulating film 3 not including a charge storage layer between the word gate electrode 1 and the active region while there is interposed a trap insulating film 4 including a charge storage layer between the control gate 2 and the active region. In this manner, a so-called split-gate semiconductor storage device was formed.

Figure 14A:
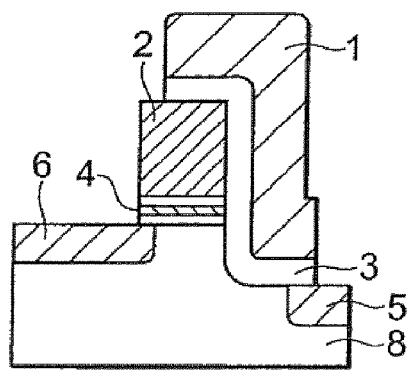
FIG. 14A is a sectional view taken along the line I-I' of FIG. 13.
Figure 14B:
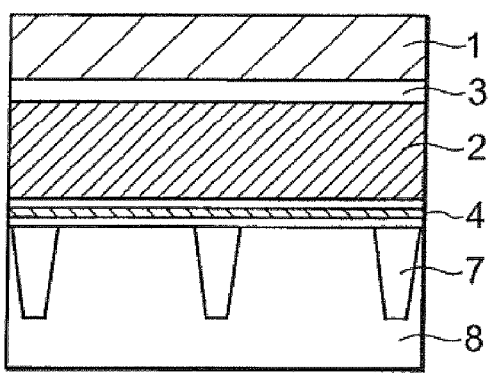
FIG. 14B is a sectional view taken along the line II-II' of FIG. 13.

FIG. 14A and FIG. 14B are sectional views taken along the lines I-I' and II-II' of FIG. 13, respectively.

In Example 3, the active region is defined on a silicon substrate 8 by the device isolation region 7. The source-drain regions 5 and 6 which are impurity diffusion layers of n conductive type are formed in the active region. A region sandwiched between the source-drain regions 5 and 6 is made to be a channel forming region of p conductive type. The control gate 2 is formed on the channel forming region on the side of the source-drain region 6 via the trap insulating film 4. A step portion is formed in the silicon substrate 8 on one side of the control gate 2 in self-alignment with the control gate 2. The word gate electrode 1 is formed on a side surface and a bottom surface of the step portion of the silicon substrate so as to ride on the control gate 2 via the word gate insulating film 3. Here, the semiconductor storage device of this invention is characterized in that the level of the bottom of the control gate 2 is higher than the level of the bottom of the word gate electrode 1. The level difference is made to be larger than the physical thickness of the trap insulating film 4.

In this example, the trap insulating film 4 had a three layer lamination structure of a silicon oxide film/a silicon nitride film/a silicon oxide film. Further, the word gate insulating film 3 was formed of silicon oxide. to A manufacturing method of Example 3 of this invention is briefly described in the following. FIGS. 15A to 15H are sectional views illustrating manufacturing steps in due order of the manufacturing method of Example 3 taken along the line I-I' of FIG. 13.

Figure 15A:
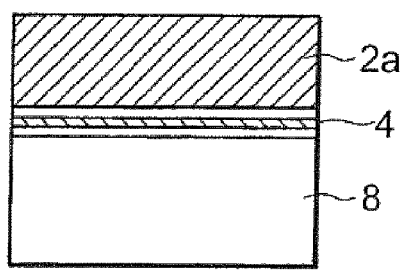
FIGS. 15A to 15H are sectional views illustrating manufacturing steps in due order of a manufacturing method of Example 3 of this invention.

First, as illustrated in FIG. 15A, by oxidizing the entire surface of the silicon substrate 8, an underlayer oxide film of the trap insulating film was formed. By depositing thereon a silicon nitride film to be a charge storage layer using the chemical vapor deposition (CVD) method, and further, oxidizing the surface of the silicon nitride film, the trap insulating film 4 having a three layer structure of a silicon oxide film/a silicon nitride film/a silicon oxide film was formed. It should be noted that, in the oxidation, in situ steam generation (ISSG) oxidation was used. Further, polysilicon doped with phosphorus which was a control gate material was deposited on the trap insulating film 4 to form a control gate material layer 2a.

Figure 15B:
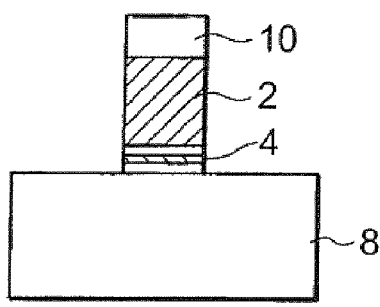

Then, as illustrated in FIG. 15B, by forming a hard mask 10 patterned in the shape of the control gate and carrying out dry etching of the control gate material layer 2a, the control gate 2 was formed. Further, by carrying out dry etching of the trap insulating film 4, the surface of the silicon substrate 8 was exposed.

Figure 15C:
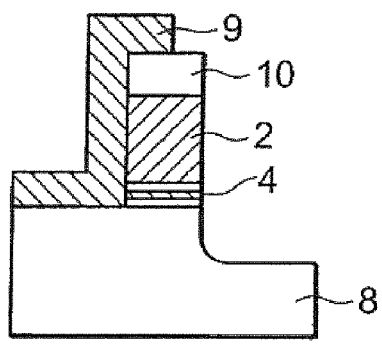

Then, as illustrated in FIG. 15C, by forming a resist mask 9 patterned so as to cover one side of the control gate 2 and so as to ride on the control gate 2 and carrying out dry etching using the patterned resist mask 9 and the hard mask 10 as an etching stop layer, the silicon substrate 8 was etched only on one side of the control gate 2 to form a groove portion. After the groove portion was formed, the resist mask 9 and the hard mask 10 were removed in a wet process.

Figure 15D:
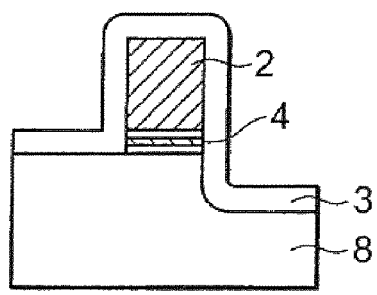

Then, as illustrated in FIG. 15D, the surface was oxidized to form the word gate insulating film 3. It should be noted that, in the oxidation, radical oxidation or the like in which the oxidation rate depends less on the plane orientation is preferably used. Here, ISSG oxidation was used.

Figure 15E:
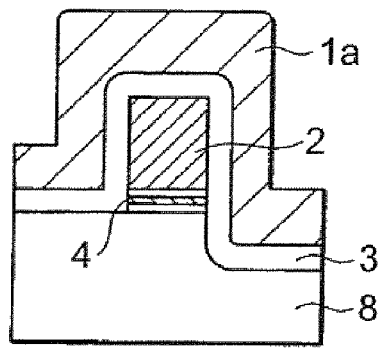

Then, as illustrated in FIG. 15E, polysilicon doped with phosphorus was deposited on the entire surface to form a word gate material layer 1a.

Figure 15F:
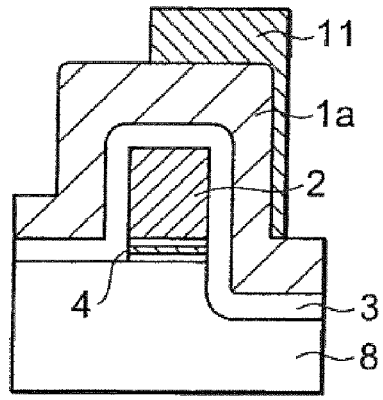
Figure 15G:
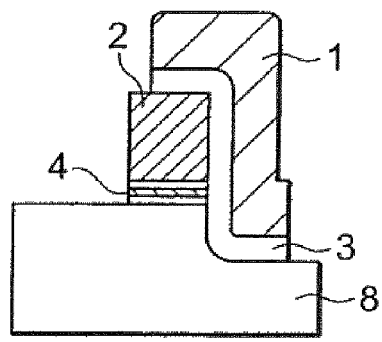

Next, as illustrated in FIG. 15F, a resist mask 11 patterned so as to overlap a part of the groove portion in the semiconductor substrate and a part of the control gate 2 was formed.

Then, as illustrated in FIG. 15Q the word gate electrode 1 was formed by carrying out dry etching using the resist mask 11, and the exposed word gate insulating film 3 was removed. After that, the resist mask 11 was removed in a wet process.

Figure 15H:
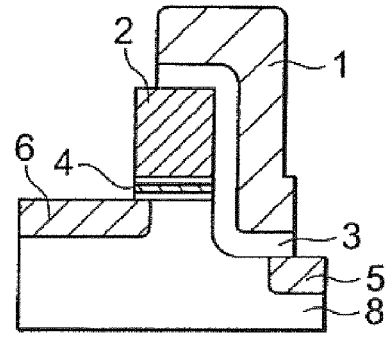

Finally, as illustrated in FIG. 15H, by carrying out ion implantation, the source-drain regions 5 and 6 were formed. After that, a wiring process including deposition of an interlayer insulating film and provision of contact holes was carried out.

EXAMPLE 4

Figure 16:
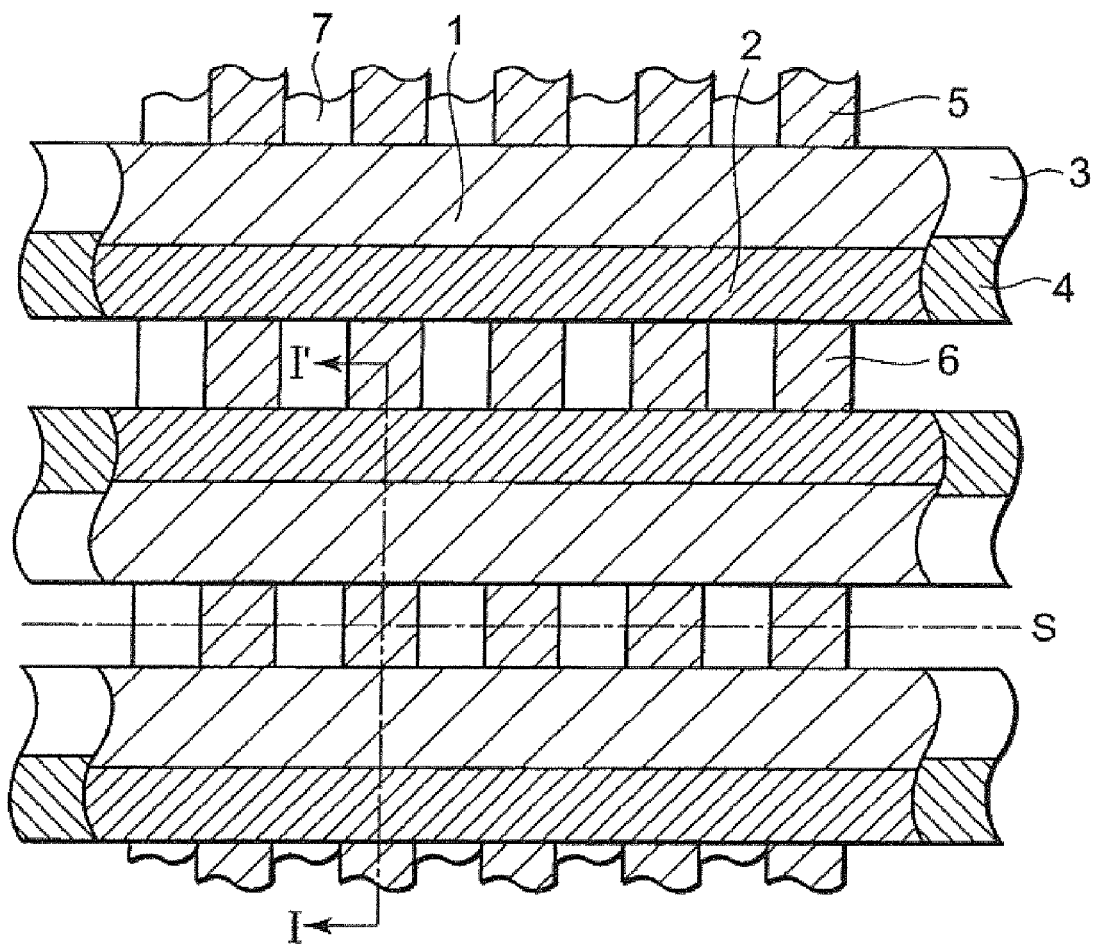
FIG. 16 is a plan view of Example 4 of this invention.

FIG. 16 is a plan view of a semiconductor storage device according to Example 4 of this invention. As illustrated in FIG. 16, in the storage device of this example, a device isolation region 7 is formed in predetermined regions in a semiconductor substrate to define active regions including source-drain regions 5 and 6 and a channel region. The active regions are crossed by a plurality of word gate electrodes 1 and control gates 2. There is interposed a word gate insulating film 3 not including a charge storage layer between the word gate electrode 1 and the active region while there is interposed a trap insulating film 4 including a charge storage layer between the control gate 2 and the active region.

Figure 17:
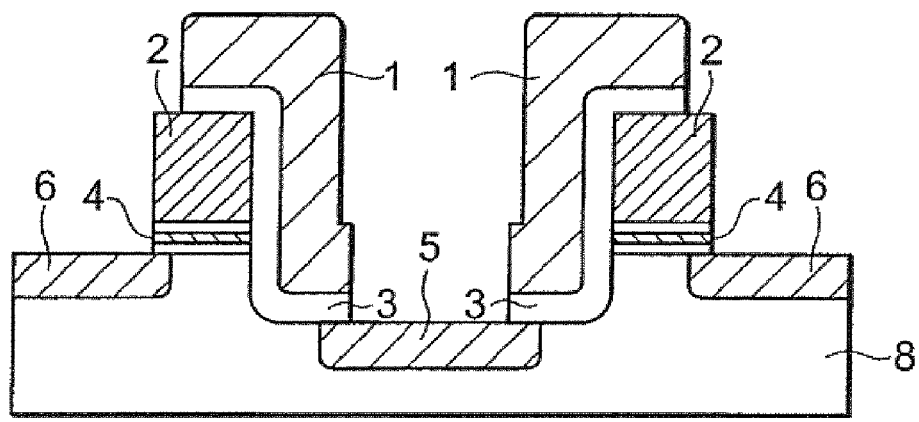
FIG. 17 is a sectional view taken along the line I-I' of FIG. 16.

FIG. 17 is a sectional view taken along the line I-I' of FIG. 12. In Example 4, the source-drain regions 5 and 6 are formed in the active region defined by the device isolation region 7 on a silicon substrate 8, and a region sandwiched between the source-drain regions 5 and 6 is made to be a channel forming region. The control gates 2 are formed on the channel forming regions on the side closer to the source-drain regions 6 via the trap insulating films 4, and a groove portion is formed in the silicon substrate 8 between the two control gates 2. The word gate electrodes 1 are formed on side surfaces and part of a bottom surface of the groove portion in the silicon substrate so as to ride on the control gates 2 via the word gate insulating films 3. The word gate insulating film 3 insulates between the word gate electrode 1 and the control gate 2.

It should be noted that, in Example 4, the memory elements of Example 3 illustrated in FIG. 13 and FIG. 14 are disposed so as to be symmetrical with respect to a plane S (see FIG. 16) which is perpendicular to the direction of a channel length. Such disposition makes it possible to share the source-drain regions 5 and 6 formed on a principal surface of the semiconductor substrate and in the groove portion between adjacent memory cells as illustrated in FIG. 13, and thus, the area of the memory can be reduced. Further, a manufacturing method of Example 4 is similar to the manufacturing method of Example 3 illustrated in FIG. 15, and therefore description thereof is omitted.

EXAMPLE 5

FIG. 18 is a plan view of a semiconductor storage device according to Example 5 of this invention. As illustrated in FIG. 18, in the storage device of this example, a device isolation region 7 is formed in predetermined regions in a semiconductor substrate to define active regions including source-drain regions 5 and 6 and a channel region. The active regions are crossed by a plurality of word 6 gate electrodes 1 and control gates 2. There is interposed a word gate insulating film 3 not including a charge storage layer between the word gate 1 and the active region while there is interposed a trap insulating film 4 including a charge storage layer between the control gate 2 and the active region, and a so-called split-gate type semiconductor storage device is formed.

FIG. 19A and FIG. 19B are sectional views taken along the lines I-I' and II-II', respectively, of FIG. 18. In Example 5, the active region is defined on a silicon substrate 8 by the device isolation region 7. The source-drain regions 5 and 6 which are impurity diffusion layers of n conductive type are formed in the active region. A region sandwiched between the source-drain regions 5 and 6 is made to be a channel forming region of p conductive type.

The word gate electrode 1 is formed on the channel forming region on the side closer to the source-drain region 6 via the word gate insulating film 3. A step portion is formed in the silicon substrate 8 on one side of the word gate electrode 1 in self-alignment with the word gate electrode 1. The control gate 2 is formed on a side surface and a bottom surface of the step portion in the silicon substrate so as to ride on the word gate electrode 1 via a trap insulating film 4. The trap insulating film 4 insulates between the word gate electrode 1 and the control gate 2. In this example, the level of the bottom of the control gate 2 is made to be lower than the level of the bottom of the word gate electrode. For the purpose of making at the maximum the electric field applied from the electrodes to the channel in the vicinity of the boundary between the word gate 1 and the control gate 2, the level difference between the bottoms of the electrodes is made to be larger than the physical thickness of the word gate insulating film 3.

In this example, the trap insulating film 4 had a three layer lamination structure of a silicon oxide film/a silicon nitride film/a silicon oxide film. Further, a silicon oxide film is used as the word gate insulating film 3. It should be noted that, because a manufacturing method of Example 5 is similar to a manufacturing method of Example 6 to be described later and illustrated in FIG. 22, description thereof is omitted.

EXAMPLE 6

Figure 20:
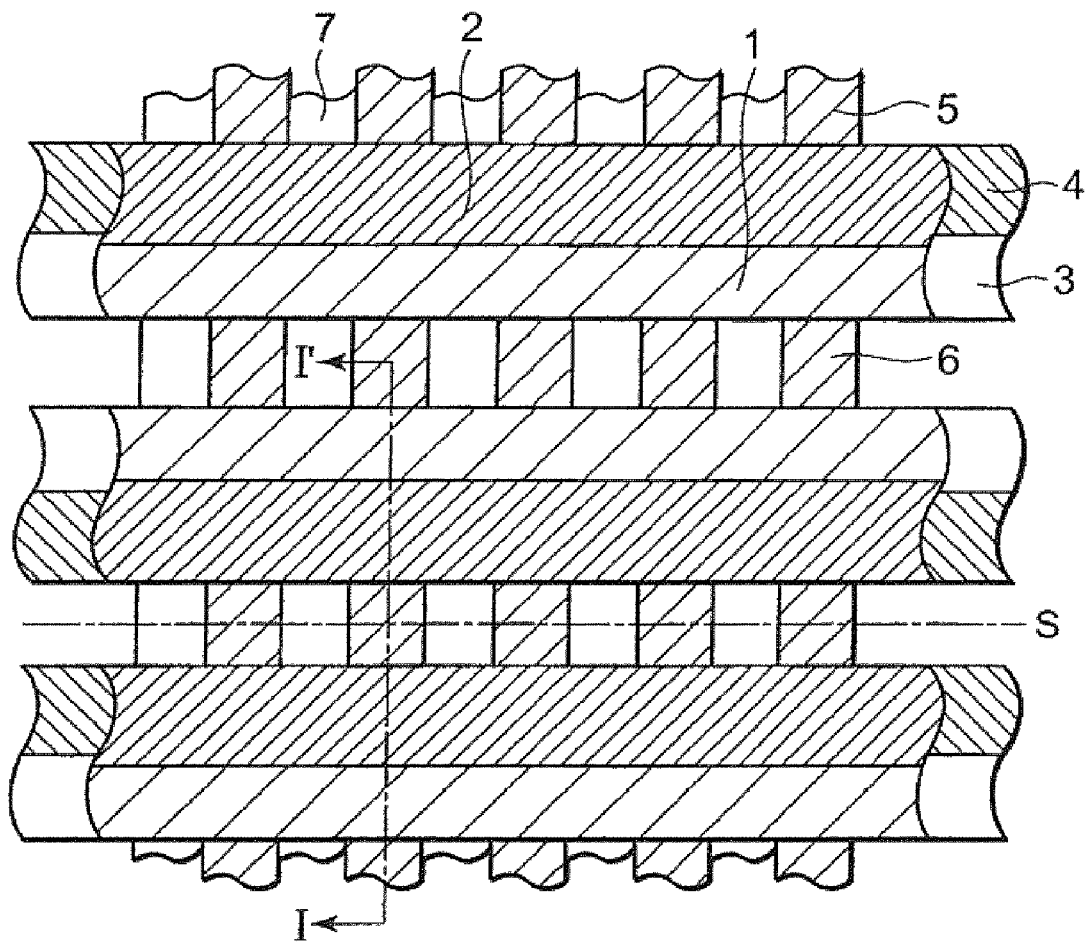
FIG. 20 is a plan view of Example 6 of this invention.

FIG. 20 is a plan view of a semiconductor storage device according to Example 6 of this invention. As illustrated in FIG. 20, in the storage device of this example, a device isolation region 7 is formed in predetermined regions in a semiconductor substrate to define active regions including source-drain regions 5 and 6 and a channel region. The active regions are crossed by a plurality of word gate electrodes 1 and control gates 2. There is interposed a word gate insulating film 3 not including a charge storage layer between the word gate 1 and the active region while there is interposed a trap insulating film 4 including a charge storage layer between the control gate 2 and the active region.

Figure 21:
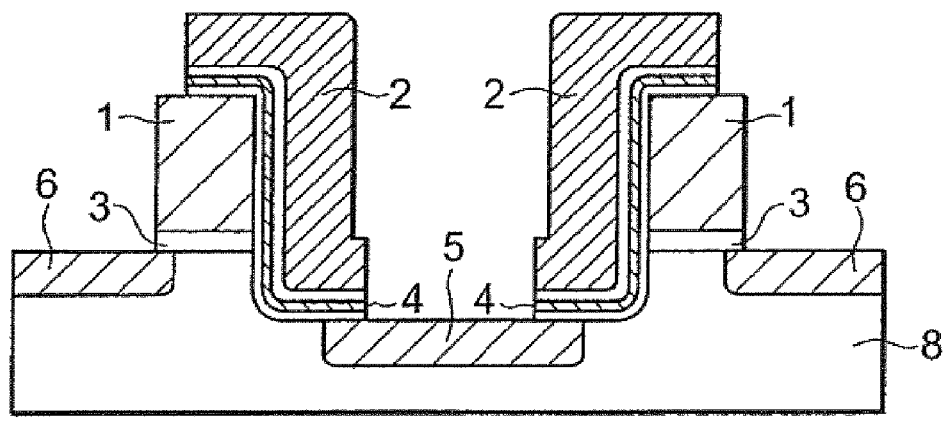
FIG. 21 is a sectional view taken along the line I-I' of FIG. 20.

FIG. 21 is a sectional view taken along the line I-I' of FIG. 20. In Example 6, the active region is defined by the device isolation region on a silicon substrate 8, the source-drain regions 5 and 6 which are impurity diffusion layers of n conductive type are formed in the active region, and a region sandwiched between the source-drain regions 5 and 6 is made to be a channel forming region of p conductive type. The word gate electrodes 1 are formed on the channel forming regions on the side closer to the source-drain regions 6 via the word gate insulating films 3, and a groove portion is formed in the silicon substrate 8 between the two word gate electrodes 1. The control gates 2 are formed on side surfaces and part of a bottom surface of the groove portion in the silicon substrate so as to ride on the word gate electrodes 1 via the trap insulating films 4. The trap insulating film 4 insulates between the word gate electrode 1 and the control gate 2.

It should be noted that, in Example 6, the memory elements of Example 5 illustrated in FIG. 18 and FIG. 19 are disposed so as to be symmetrical with respect to a plane S (see FIG. 20) which is perpendicular to the direction of a channel length. Such disposition makes it possible to share the source-drain regions 5 and 6 formed on a principal surface of the semiconductor substrate and in the groove portion between adjacent memory cells as illustrated in FIG. 20 and FIG. 21, and thus, the area of the memory can be reduced.

A manufacturing method of Example 6 of this invention is briefly described in the following. FIGS. 22A to 22G are sectional views illustrating manufacturing steps in due order of the manufacturing method of Example 6 taken along the line I-I' of FIG. 20.

First, as illustrated in FIG. 22A, the word gate insulating film 3 formed of a silicon oxide film was formed by thermal oxidation on the silicon substrate 8, and polysilicon doped with phosphorus was deposited thereon to form a word gate electrode material layer 1a.

Further, as illustrated in FIG. 22B, a patterned resist mask 9 was formed. By carrying out dry etching, the word gate electrode material layer 1a was patterned. By removing the exposed word gate insulating film 3, the silicon substrate 8 was exposed. Additional dry etching was carried out with the resist mask 9 being used as a mask and the silicon substrate 8 was digged down to form the groove portion in the substrate. The amount of digging down the silicon substrate 8 was set to be larger than the thickness of the word gate insulating film 3 and than the thickness of the trap insulating film to be formed later.

After the additional dry etching, the resist mask 9 was removed in a wet process. Next, as illustrated in FIG. 22C, a patterned resist mask 11 was formed. By carrying out dry etching, the word gate electrode material layer 1a was processed into the word gate electrode 1. Further, by removing the exposed word gate insulating film 3, the surface of the silicon substrate 8 was exposed. Then, the resist mask 11 was removed in a wet process.

Next, as illustrated in FIG. 22D, by oxidizing the entire surface of the substrate, an underlayer oxide film of the trap insulating film was formed. By depositing thereon a silicon nitride film to be a charge storage layer using the chemical vapor deposition (CVD) method, and further, oxidizing the surface of the silicon nitride film, the trap insulating film 4 having a three layer structure of a silicon oxide film/a silicon nitride film/a silicon oxide film was formed. It should be noted that, in the oxidation, in situ steam generation (ISSG) oxidation, in which the oxidation rate depends less on the plane orientation, was used.

Then, as illustrated in FIG. 22E, polysilicon doped with phosphorus was deposited on the entire surface to form a control gate material layer 2a. Next, as illustrated in FIG. 22F, a patterned resist mask 12 was formed. By carrying out dry etching, the control gate material layer 2a was processed into the control gate 2. Further, by removing the exposed trap insulating film 4, the silicon substrate 8 was exposed.

Finally, as illustrated in FIG. 22G, by carrying out ion implantation, the source-drain regions 5 and 6 were formed. After that, a wiring process including deposition of an interlayer insulating film and provision of contact holes was carried out.

This invention has been specifically described based on the embodiments, but this invention is not limited to the above-mentioned embodiments, and various modifications are possible which fall within the gist of this invention. It goes without saying that such modifications are also included in the present application.

INDUSTRIAL APPLICABILITY

This invention is applicable to semiconductor devices including a rewritable nonvolatile semiconductor memory cell which includes a trap type. For example, this invention is applicable to a so-called split-gate type which has two gate electrodes or to a three gate electrode structure in which a control gate is formed on each side of a word gate electrode (Twin MONOS).

This application is the National Phase of PCT/JP2007/071860, filed Nov. 5, 2007, which is based upon and claims priority from Japanese Patent Application No. 2006-307373 filed on Nov. 14, 2006, the entire disclosure of which is incorporated herein.

The invention claimed is:

1. A semiconductor device comprising:
a plurality of gate electrodes formed via an insulating film on a base, at least a surface of the base being formed of a semiconductor layer;
a first diffusion layer and a second diffusion layer formed in the semiconductor layer with the plurality of gate electrodes sandwiched therebetween; and
a channel layer formed between the first diffusion layer and the second diffusion layer in the semiconductor layer, wherein:
the insulating film comprises a structure in which a plurality of insulating regions are disposed in due order from the first diffusion layer along the channel layer in the semiconductor layer toward the second diffusion layer;
at least one insulating region of the plurality of insulating regions includes a charge trap and at least one insulating region of the plurality of insulating regions does not include a charge trap;
the plurality of gate electrodes are formed on the base via the plurality of insulating regions, respectively;
the plurality of gate electrodes are insulated from adjacent ones of the gate electrodes, respectively;
levels of the channel layer formed below bottoms of the adjacent gate electrodes are different from each other, and
the insulating film is formed also on part of the first diffusion layer and part of the second diffusion layer.

2. A semiconductor device according to claim 1, wherein
the plurality of gate electrodes are extended in a first direction so as to be arranged in a second direction orthogonal to the first direction,
a plurality of the first diffusion layers and a plurality of the second diffusion layers are lined in the first direction, and
a plurality of device isolation layers are extended in the second direction so as to be arranged in the first direction.

3. A semiconductor device according to claim 1, wherein a level difference in the channel layer formed below the bottoms of the adjacent gate electrodes is larger than a physical thickness of the insulating region between the gate electrode and the channel layer.

4. A semiconductor device according to claim 1, wherein:
the insulating region including a charge trap comprises first, second, and third layers or first and second layers from a side of a channel region;
the first layer and the third layer are silicon oxide or silicon oxynitride; and
the second layer is any one of silicon nitride, silicon oxynitride, alumina, hafnium silicate, hafnium oxide, and aluminum silicate.

5. A semiconductor device according to claim 1, wherein the semiconductor layer is silicon.

6. A semiconductor device according to claim 1, wherein at least part of the channel layer in contact with the insulating region including a charge trap is formed along a surface perpendicular to a principal surface of the semiconductor layer and a crystal orientation of the surface is substantially a (100) surface or a (311) surface (including a crystallographically equivalent surface).

7. A semiconductor device comprising:
a first gate electrode, a second gate electrode, and a third gate electrode formed via an insulating film on a base, at least a surface of the base being formed of a semiconductor layer;
a first diffusion layer and a second diffusion layer formed in the semiconductor layer with the first to third gate electrodes sandwiched therebetween; and
a channel layer formed between the first diffusion layer and the second diffusion layer in the semiconductor layer, wherein:
the insulating film comprises a structure in which a first insulating region including a charge trap, a second insulating region not including a charge trap, and a third insulating region including a charge trap are disposed in this order from the first diffusion layer along the channel layer in the semiconductor layer toward the second diffusion layer;

the first gate electrode is formed on the base via the first insulating region, the second gate electrode is formed via the second insulating region, and the third gate electrode is formed via the third insulating region;

the first to third gate electrodes are insulated from adjacent ones of the gate electrodes, respectively;

levels of the channel layer formed below bottoms of the adjacent gate electrodes are different from each other; and tips of the first diffusion layer and of the second diffusion layer on a side of a channel each reach a region immediately below the second gate electrode.

8. A semiconductor device according to claim 7, wherein the gate electrode group are extended in a first direction so as to be arranged in a second direction orthogonal to the first direction, a plurality of the first diffusion layers and a plurality of the second diffusion layers are lined in the first direction, and a plurality of device isolation layers are extended in the second direction so as to be arranged in the first direction.

9. A semiconductor device according to claim 7, wherein a level difference in the channel layer formed below the bottoms of the adjacent gate electrodes is larger than a physical thickness of the insulating region between the gate electrode and the channel layer.

10. A semiconductor device according to claim 7, wherein the channel layer formed below bottoms of the first and third gate electrodes is lower than the channel layer formed below a bottom of the second gate electrode.

11. A semiconductor device according to claim 7, wherein:
a shortest distance between an arbitrary point of the channel layer in contact with the first insulating region and the first gate electrode is less than $\sqrt{2}$ times a physical thickness of the first insulating region; and a shortest distance between an arbitrary point of the channel layer in contact with the third insulating region and the third gate electrode is less than $\sqrt{2}$ times a physical thickness of the third insulating region.

12. A semiconductor device according to claim 7, wherein:
the first and second gate electrodes are insulated from each other by an insulating film formed with the first insulating region; and the second and third gate electrodes are insulated from each other by an insulating film formed with the third insulating region.

13. A semiconductor device according to claim 7, wherein a level of a base principal surface on which the first diffusion layer is formed is equal to a level of a base principal surface on which the second diffusion layer is formed.

14. A semiconductor device comprising:
a first gate electrode, a second gate electrode, and a third gate electrode formed via an insulating film on a base, at least a surface of the base being formed of a semiconductor layer;

a first diffusion layer and a second diffusion layer formed in the semiconductor layer with the first to third gate electrodes sandwiched therebetween; and a channel layer formed between the first diffusion layer and the second diffusion layer in the semiconductor layer, wherein:
the insulating film comprises a structure in which a first insulating region including a charge trap, a second insulating region not including a charge trap, and a third insulating region including a charge trap are disposed in this order from the first diffusion layer along the channel layer in the semiconductor layer toward the second diffusion layer;

the first gate electrode is formed on the base via the first insulating region, the second gate electrode is formed via the second insulating region, and the third gate electrode is formed via the third insulating region;

the first to third gate electrodes are insulated from adjacent ones of the gate electrodes, respectively;

levels of the channel layer formed below bottoms of the adjacent gate electrodes are different from each other; and the channel layer formed below a bottom of the second gate electrode is lower than the channel layer formed below bottoms of the first and third gate electrodes.

15. A semiconductor device according to claim 14, wherein a shortest distance between an arbitrary point of the channel layer in contact with the second insulating region and the second gate electrode is less than $\sqrt{2}$ times a physical thickness of the second insulating region.

16. A semiconductor device according to claim 14, wherein the first and second gate electrodes and the second and third gate electrodes are insulated from each other, respectively, by an insulating film formed with the second insulating region.

17. A semiconductor device comprising:
a first gate electrode and a second gate electrode formed via an insulating film on a base, at least a surface of the base being formed of a semiconductor layer;

a first diffusion layer and a second diffusion layer formed in the semiconductor layer with the first and second gate electrodes sandwiched therebetween; and a channel layer formed between the first diffusion layer and the second diffusion layer in the semiconductor layer, wherein:
the insulating film comprises a structure in which a first insulating region and a second insulating region are disposed in this order from the first diffusion layer along the channel layer in the semiconductor layer toward the second diffusion layer;

one of the first and second insulating regions includes a charge trap;

the first gate electrode is formed on the base via the first insulating region and the second gate electrode is formed via the second insulating region;

the first and second gate electrodes are insulated from each other;

levels of the channel layer formed below bottoms of the first and second gate electrodes are different from each other; and a tip of the diffusion layer which is nearer to the insulating region not including a charge trap on a side of a channel reaches a region immediately below the gate electrode formed on the insulating region including a charge trap.

18. A semiconductor device according to claim 17, wherein a plurality of the first gate electrodes and a plurality of the second gate electrodes are extended in a first direction so as to be arranged in a second direction orthogonal to the first direction, a plurality of the first diffusion layers and a plurality of second diffusion layers are lined in the first direction, and a plurality of device isolation layers are extended in the second direction so as to be arranged in the first direction.

19. A semiconductor device according to claim 17, wherein the level of the channel layer formed below the bottom of the gate electrode formed on the base via the insulating region not including a charge trap is lower than the level of the channel layer formed below the bottom of the gate electrode formed on the base via the insulating region including a charge trap.

20. A semiconductor device according to claim 17, wherein a shortest distance between an arbitrary point of the channel layer in contact with the insulating region not including a charge trap and the gate electrode formed on the base via the insulating region not including a charge trap is less than $\sqrt{2}$ times a physical thickness of the insulating region not including a charge trap.

21. A semiconductor device according to claim 17, wherein the first and second gate electrodes are insulated from each other by an insulating film formed with the insulating region not including a charge trap.

22. A semiconductor device according to claim 17, wherein a level difference in the channel layer formed below the bottoms of the first and second gate electrodes is larger than the physical thickness of the insulating region between the gate electrode and the channel layer.

23. A semiconductor device having a cell structure defined in the semiconductor device according to claim 17 as a memory element,
wherein two such memory elements are formed so as to be adjacent to each other and left-right symmetric.

24. A semiconductor device comprising:
a first gate electrode and a second gate electrode formed via an insulating film on a base, at least a surface of the base being formed of a semiconductor layer;
a first diffusion layer and a second diffusion layer formed in the semiconductor layer with the first and second gate electrodes sandwiched therebetween; and
a channel layer formed between the first diffusion layer and the second diffusion layer in the semiconductor layer, wherein:
the insulating film comprises a structure in which a first insulating region and a second insulating region are disposed in this order from the first diffusion layer along the channel layer in the semiconductor layer toward the second diffusion layer;
one of the first and second insulating regions includes a charge trap;
the first gate electrode is formed on the base via the first insulating region and the second gate electrode is formed via the second insulating region;
the first and second gate electrodes are insulated from each other;
levels of the channel layer formed below bottoms of the first and second gate electrodes are different from each other; and
a tip of the diffusion layer which is nearer to the insulating region including a charge trap on a side of a channel reaches a region immediately below the gate electrode formed on the insulating region not including a charge trap.

* * * * *